(12) United States Patent
Gotou et al.

(10) Patent No.: US 8,390,146 B2
(45) Date of Patent: Mar. 5, 2013

(54) SEMICONDUCTOR INTEGRATED CIRCUIT AND VARIOUS DEVICES PROVIDED WITH THE SAME

(75) Inventors: Tetsuji Gotou, Osaka (JP); Hiroo Yamamoto, Osaka (JP)

(73) Assignee: Panasonic Corporation, Osaka (JP)

( * ) Notice: Subject to any disclaimer, the term of this patent is extended or adjusted under 35 U.S.C. 154(b) by 483 days.

(21) Appl. No.: 12/598,392

(22) PCT Filed: Feb. 26, 2009

(86) PCT No.: PCT/JP2009/000854
§ 371 (c)(1),
(2), (4) Date: Oct. 30, 2009

(87) PCT Pub. No.: WO2009/107382
PCT Pub. Date: Sep. 3, 2009

(65) Prior Publication Data
US 2010/0133902 A1    Jun. 3, 2010

(30) Foreign Application Priority Data

Feb. 27, 2008   (JP) .................................. 2008-046258

(51) Int. Cl.
*H02J 1/10* (2006.01)
(52) U.S. Cl. .............................. 307/18; 307/64; 327/534
(58) Field of Classification Search ............... 307/18, 307/64; 327/534
See application file for complete search history.

(56) References Cited

U.S. PATENT DOCUMENTS

| | | | |
|---|---|---|---|
| 4,542,485 A * | 9/1985 | Iwahashi et al. | 365/189.09 |
| 5,828,611 A * | 10/1998 | Kaneko et al. | 365/203 |
| 6,031,778 A * | 2/2000 | Makino et al. | 365/226 |
| 6,385,117 B2 * | 5/2002 | Morishita | 365/226 |
| 6,510,071 B2 | 1/2003 | Oowaki | |
| 6,570,439 B2 * | 5/2003 | Berthold | 327/544 |
| 6,643,162 B2 * | 11/2003 | Takeuchi et al. | 365/145 |
| 6,765,429 B2 * | 7/2004 | Miyagi | 327/534 |
| 6,787,936 B2 * | 9/2004 | Nitta et al. | 307/64 |
| 6,879,193 B2 | 4/2005 | Okamoto et al. | |
| 6,941,534 B2 * | 9/2005 | Fukasawa | 257/207 |

(Continued)

FOREIGN PATENT DOCUMENTS

| | | |
|---|---|---|
| CN | 1449112 A | 10/2003 |
| CN | 1565079 A | 1/2005 |

(Continued)

OTHER PUBLICATIONS

Chinese Office Action issued in Chinese Patent Application No. 200980000328.0 dated Jun. 21, 2012.

*Primary Examiner* — Jared Fureman
*Assistant Examiner* — Alfonso Perez Borroto
(74) *Attorney, Agent, or Firm* — McDermott Will & Emery LLP

(57) ABSTRACT

A power supply potential detecting circuit detects a power supply potential of a second circuit block when a first circuit block shifts from a power supply shutdown state to a power supply feeding state or shifts from the power supply feeding state to the power supply shutdown state. Then, an operation control circuit temporarily stops a function of the second circuit block when the first circuit block shifts from the power supply shutdown state to the power supply feeding state or shifts from the power supply feeding state to the power supply shutdown state and then recovers the function of the second circuit block based on a detection result outputted from the power supply potential detecting circuit.

35 Claims, 20 Drawing Sheets

U.S. PATENT DOCUMENTS

| | | | |
|---|---|---|---|
| 7,050,920 B2 * | 5/2006 | Abe | 702/118 |
| 7,263,416 B2 * | 8/2007 | Sakurai et al. | 701/22 |
| 7,307,899 B2 * | 12/2007 | Khellah et al. | 365/189.11 |
| 7,383,138 B2 * | 6/2008 | Ito et al. | 702/60 |
| 7,446,549 B2 | 11/2008 | Tomita et al. | |
| 7,453,678 B2 * | 11/2008 | Beneditz et al. | 361/93.2 |
| 7,471,099 B2 * | 12/2008 | Kurita et al. | 324/750.3 |
| 7,480,549 B2 * | 1/2009 | Sakurai et al. | 701/22 |
| 7,516,337 B2 * | 4/2009 | Kim | 713/300 |
| 7,571,413 B1 * | 8/2009 | Ghosh Dastidar et al. | 716/136 |
| 7,576,445 B2 * | 8/2009 | Hammerschmidt | 307/10.1 |
| 7,589,584 B1 * | 9/2009 | Bui | 327/538 |
| 7,626,266 B2 * | 12/2009 | Tajika | 257/758 |
| 7,642,836 B2 * | 1/2010 | Caplan et al. | 327/534 |
| 7,684,723 B2 * | 3/2010 | Kikuchi | 399/88 |
| 7,733,690 B2 | 6/2010 | Kumamaru | |
| 7,768,239 B2 * | 8/2010 | Veselic et al. | 320/155 |
| 7,772,917 B2 * | 8/2010 | Itoh et al. | 327/534 |
| 7,872,447 B2 * | 1/2011 | Morita et al. | 320/122 |
| 7,894,294 B2 * | 2/2011 | Pyeon | 365/230.03 |
| 7,928,601 B2 * | 4/2011 | Ozawa et al. | 307/38 |
| 7,940,594 B2 * | 5/2011 | Dell et al. | 365/226 |
| 8,004,352 B1 * | 8/2011 | Wang et al. | 327/544 |
| 2002/0099963 A1 * | 7/2002 | Iwamura et al. | 713/300 |
| 2002/0171295 A1 * | 11/2002 | Nitta et al. | 307/64 |
| 2003/0042795 A1 * | 3/2003 | Veendrick et al. | 307/38 |
| 2003/0184364 A1 * | 10/2003 | Miyagi | 327/544 |
| 2005/0213380 A1 | 9/2005 | Taniguchi et al. | |
| 2006/0273662 A1 * | 12/2006 | Hachiya et al. | 307/112 |
| 2007/0038876 A1 * | 2/2007 | Berthold et al. | 713/300 |
| 2007/0083779 A1 | 4/2007 | Misaka et al. | |
| 2007/0145981 A1 * | 6/2007 | Tomita et al. | 324/509 |
| 2007/0183195 A1 * | 8/2007 | Ooishi et al. | 365/185.03 |
| 2007/0194841 A1 * | 8/2007 | Mizuno et al. | 327/565 |
| 2007/0247115 A1 * | 10/2007 | Ishikawa et al. | 320/119 |
| 2008/0048621 A1 * | 2/2008 | Yun | 320/136 |
| 2008/0054946 A1 * | 3/2008 | Kanno et al. | 326/102 |
| 2009/0045833 A1 * | 2/2009 | Kawasaki | 324/765 |
| 2010/0060256 A1 * | 3/2010 | Ishikawa et al. | 324/76.11 |
| 2011/0133571 A1 * | 6/2011 | Kiyohara et al. | 307/130 |
| 2011/0169471 A1 * | 7/2011 | Nagasawa | 323/283 |
| 2011/0176373 A1 * | 7/2011 | Fujiu | 365/189.09 |
| 2011/0261609 A1 * | 10/2011 | Seshadri | 365/154 |
| 2011/0279101 A1 * | 11/2011 | Sasaki et al. | 323/271 |
| 2011/0285418 A1 * | 11/2011 | Kawasaki | 324/762.01 |

FOREIGN PATENT DOCUMENTS

| | | |
|---|---|---|
| CN | 1988046 A | 6/2007 |
| CN | 101114526 B | 1/2008 |
| JP | 07-264775 | 10/1995 |
| JP | 09-321600 | 12/1997 |
| JP | 2002-158576 | 5/2002 |
| JP | 2003-289245 | 10/2003 |
| JP | 2004-229193 | 8/2004 |
| JP | 2006-050117 | 2/2006 |
| WO | WO-03/085501 A1 | 10/2003 |

* cited by examiner

F I G. 1
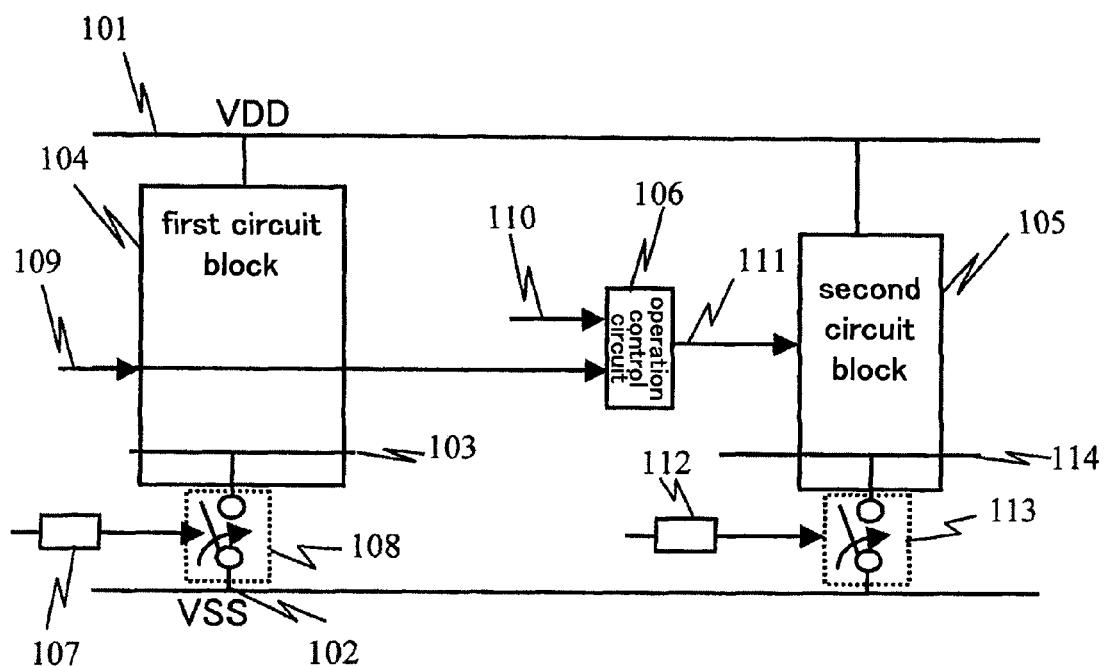

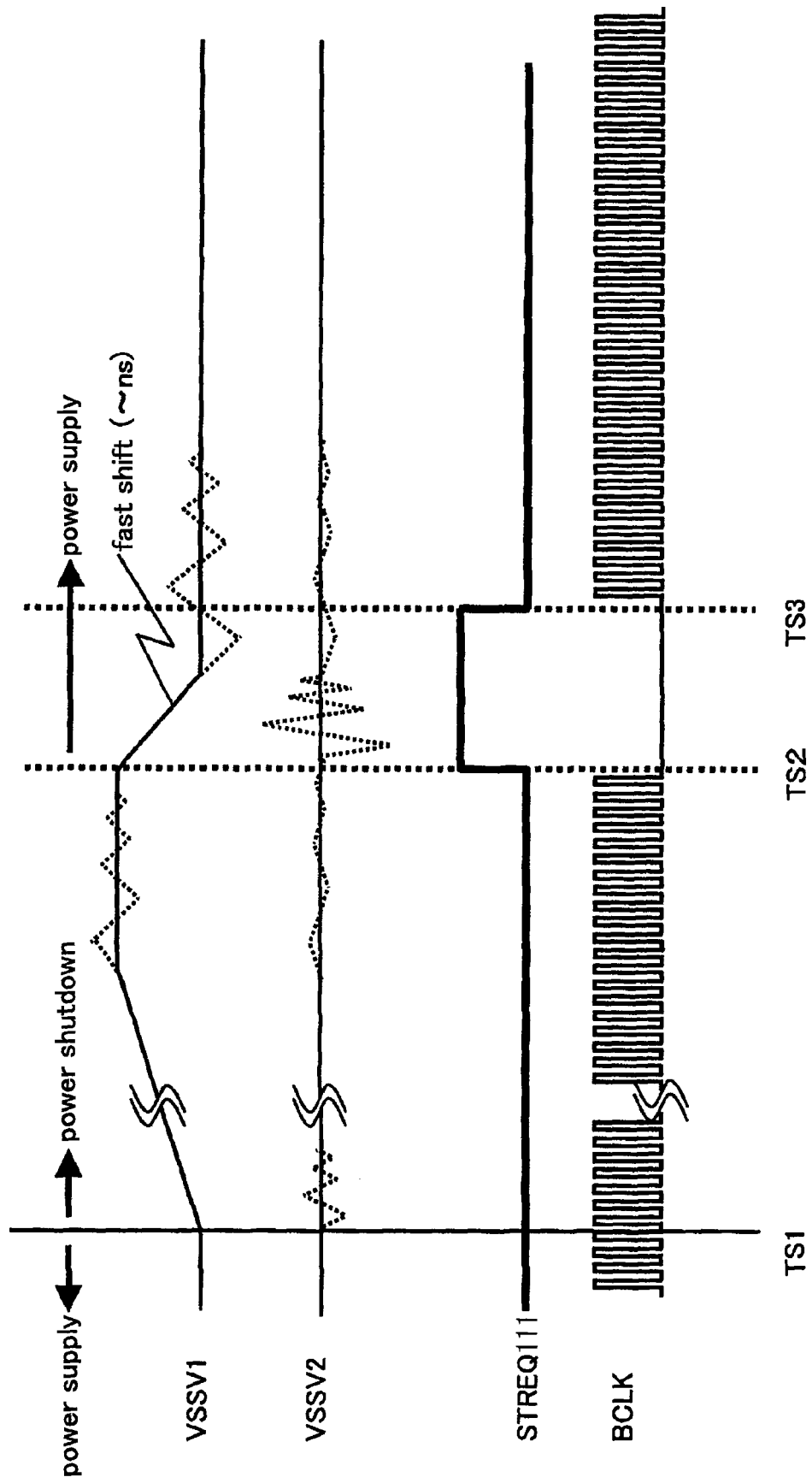

F I G. 5 B
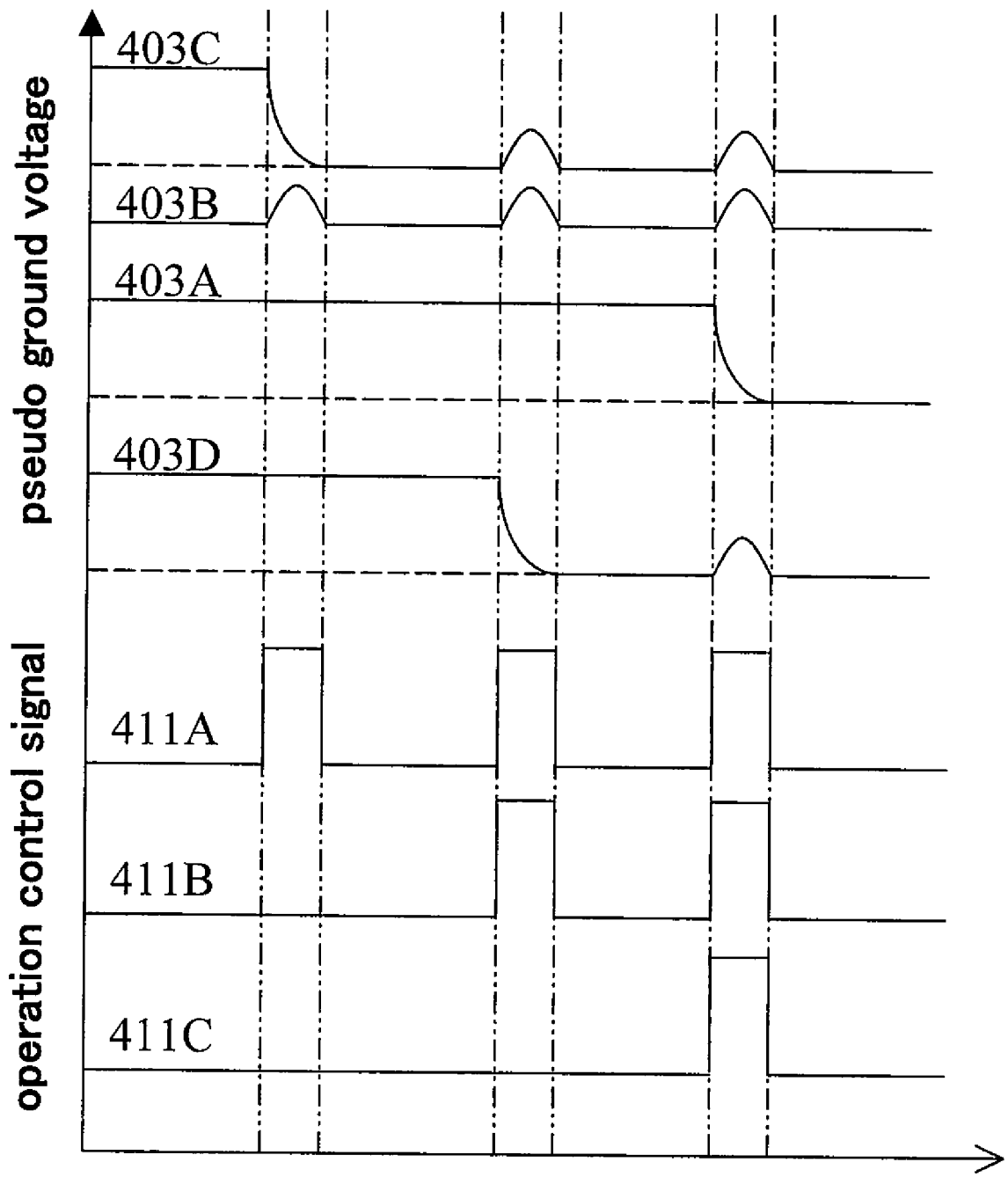

F I G. 8
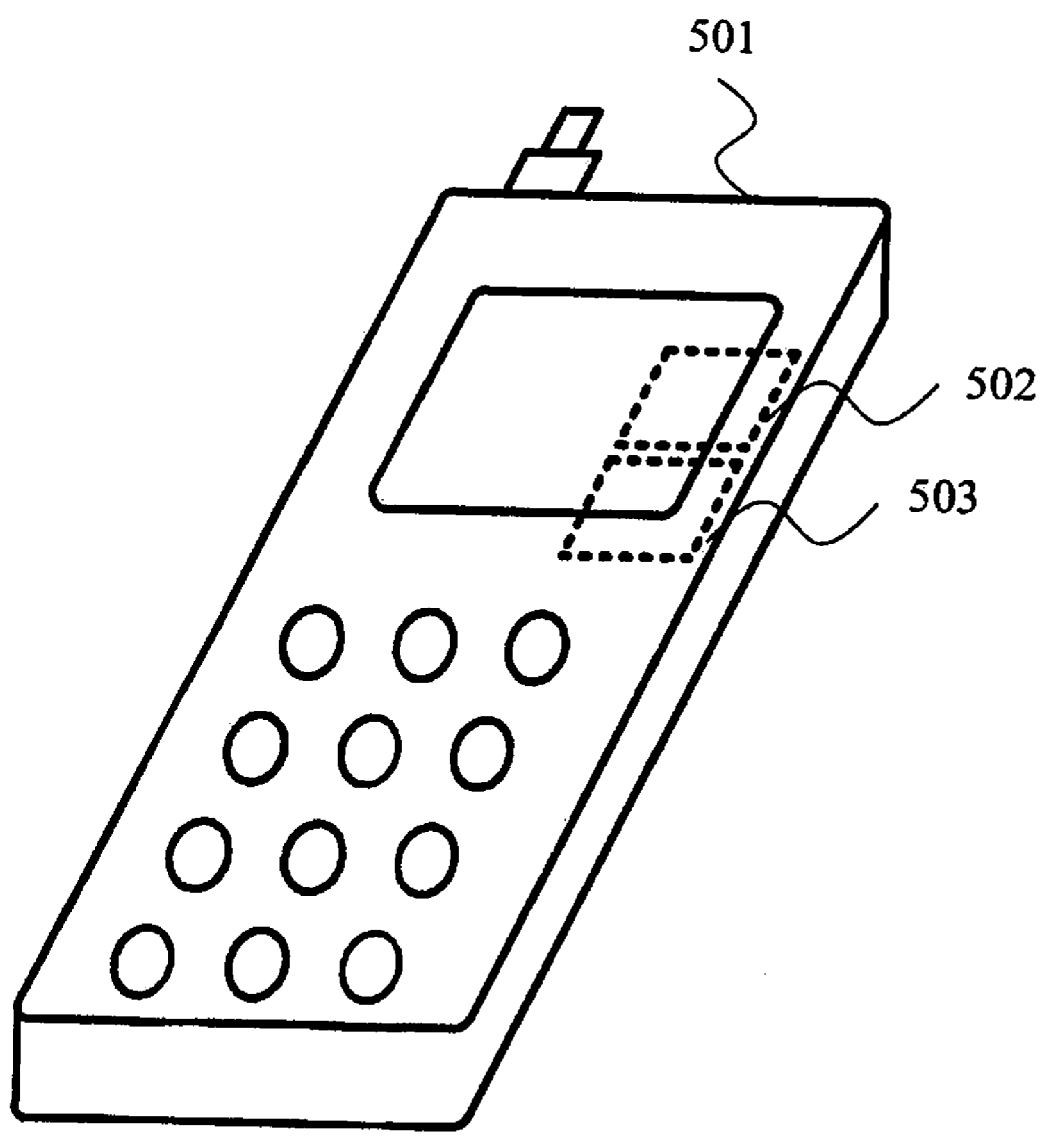

F I G. 1 6
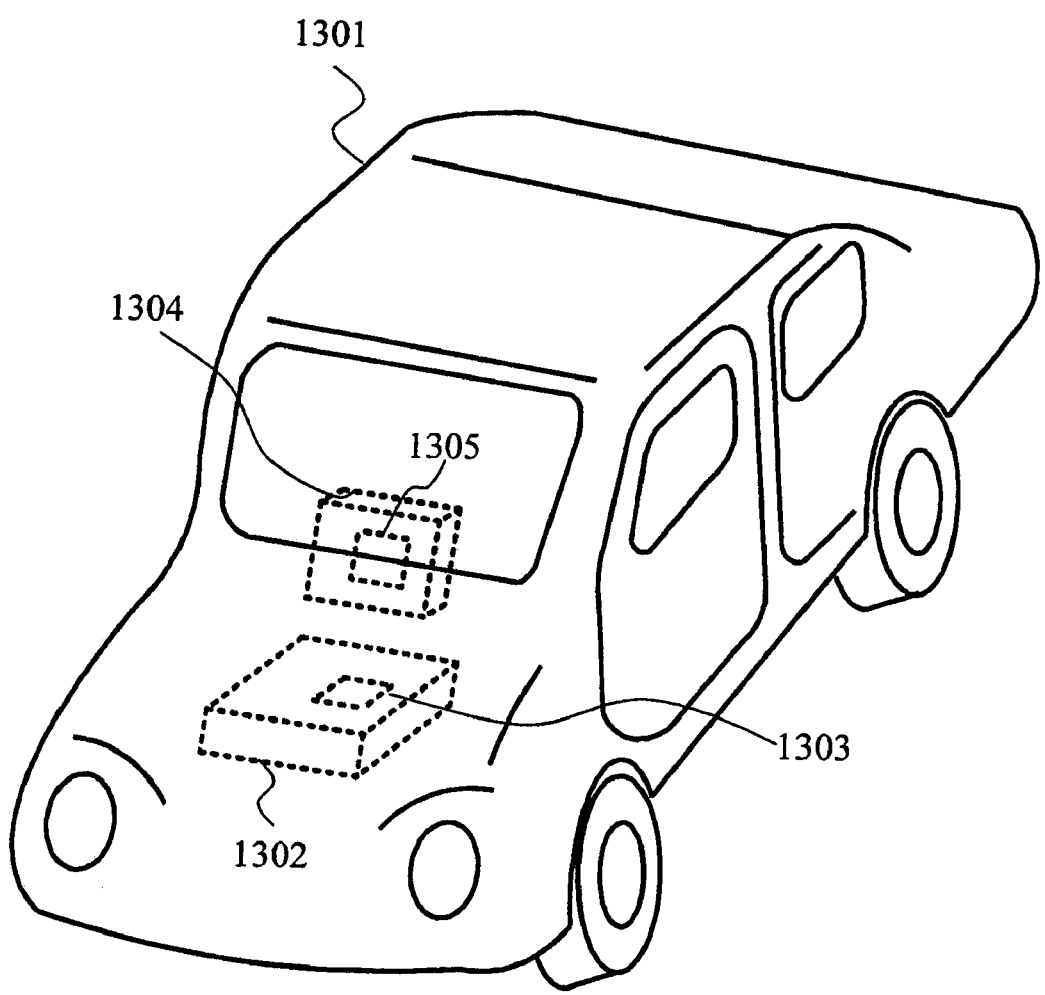

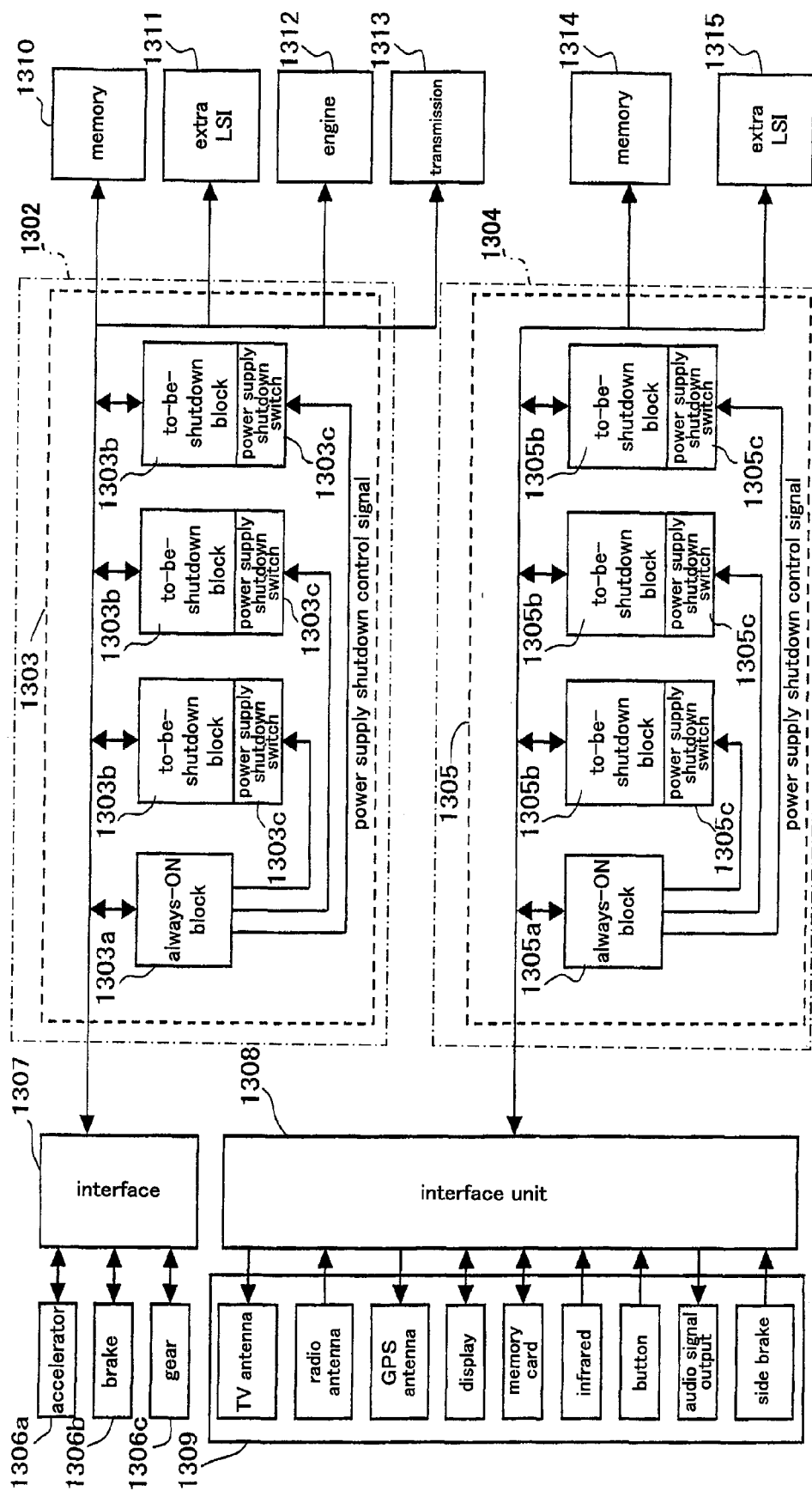
F I G. 17

F I G. 1 8
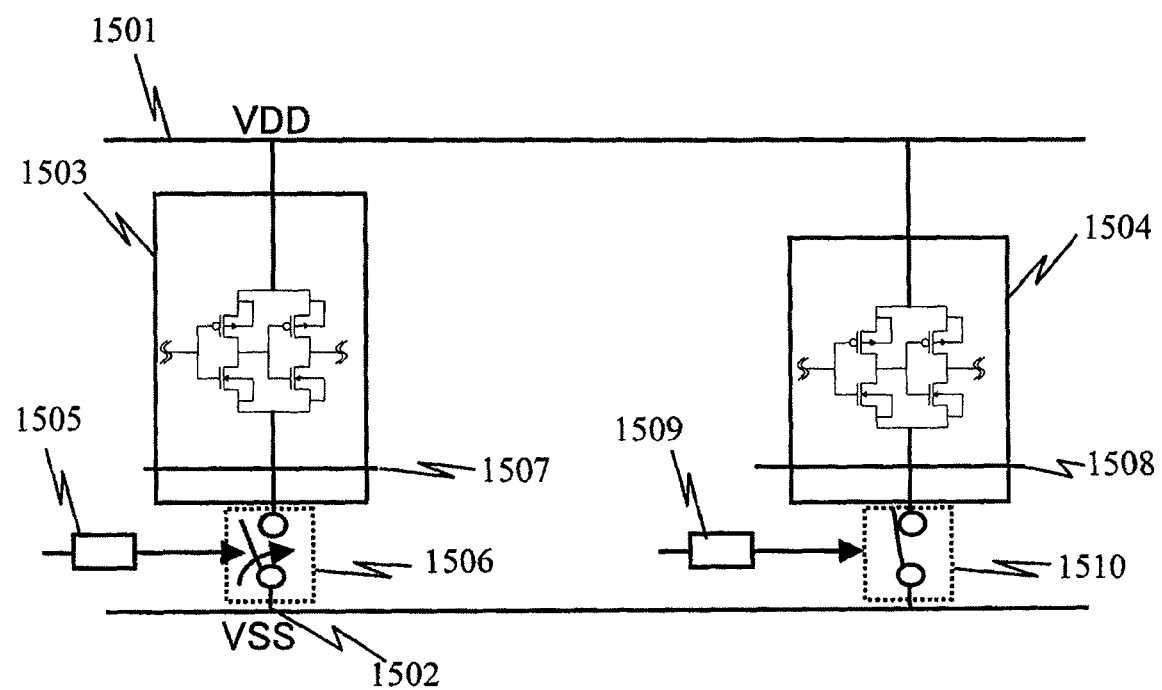

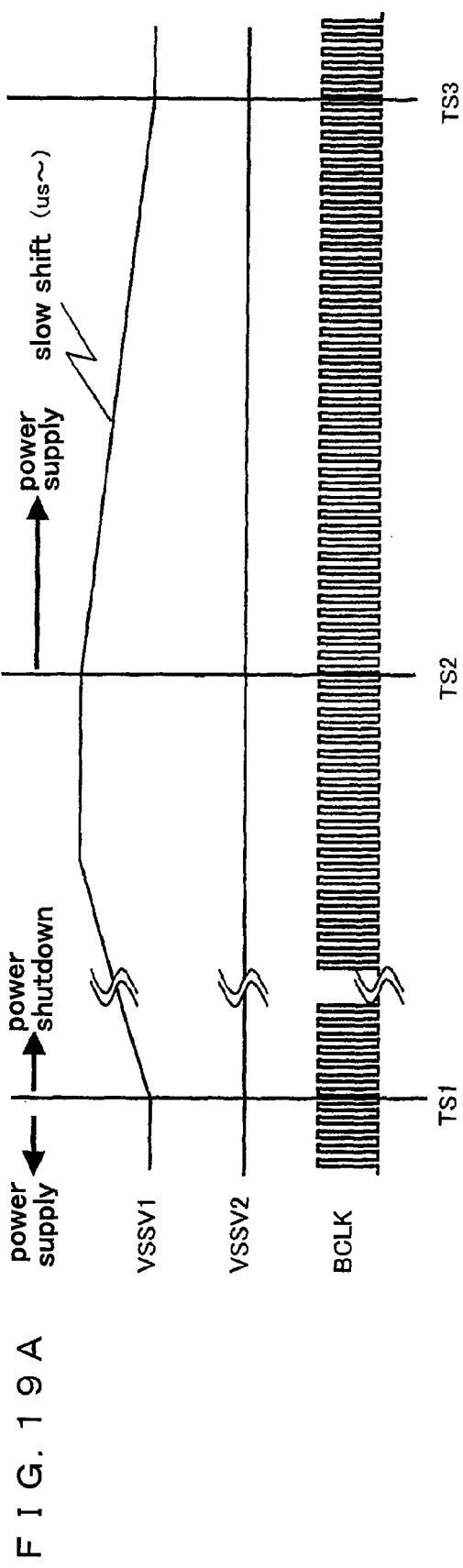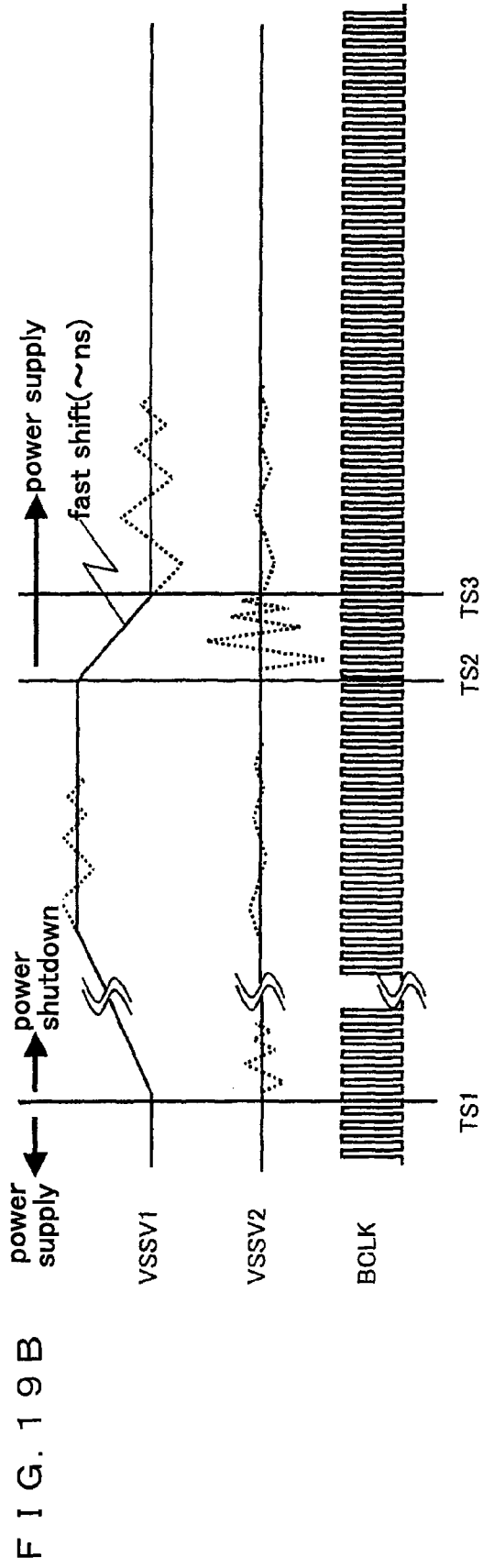

SEMICONDUCTOR INTEGRATED CIRCUIT AND VARIOUS DEVICES PROVIDED WITH THE SAME

RELATED APPLICATIONS

This application is the U.S. National Phase under 35 U.S.C. §371 of International Application No. PCT/JP2009/000854, filed on Feb. 26, 2009, which in turn claims the benefit of Japanese Application No. 2008-046258, filed on Feb. 27, 2008, the disclosures of which Applications are incorporated by reference herein.

FIELD OF THE INVENTION

The present invention relates to a technology for shutting down a power supply which is conducive to reducing power consumption in a semiconductor integrated circuit.

BACKGROUND OF THE INVENTION

FIG. 18 is an illustration of a conventional technology for shutting down a power supply, wherein a first circuit block 1503 is connected to a power supply 1501 and also to a ground power supply 1502 by way of a power supply shutdown switch 1506.

A plurality of NMOS transistors constitute the power supply shutdown switch 1506, and the power supply shutdown switch 1506 is turned on and off by a power supply shutdown switch control circuit 1505. The power supply shutdown switch 1506 is turned on when the first circuit block 1503 is operating, while the power supply shutdown switch 1506 is turned off when the first circuit block 1503 is not operating. According to the constitution, the first circuit block 1503 is disconnected from the ground power supply 1502 by the power supply shutdown switch 1506 when the circuit is in a non-operating state.

In the non-operating state, a potential of a pseudo ground power supply 1507 is increased to a level as high as a potential of the power supply 1501 in accordance with a proportion of a leak current of the first circuit block 1503 to a leak current of the power supply shutdown switch 1506, based on which the leak current of the first circuit block 1503 is reduced to at most approximately 1/100 comparing to a leak current in standstill.

Thus, the power supply shutdown technology can largely reduce electric power consumed in LSI when it is applied to a circuit block which does not need to operate and a circuit block which is not required to retain data. The power supply shutdown technology, therefore, is used in, for example, LSIs developed for mobile devices.

When the power supply is repeatedly turned on and off in a short period of time in a plurality of circuit blocks to which the power supply shutdown technology is applied, a noise is generated from the power supply due to a rush current and a resistance of a power supply wire, and the circuit under operating conditions thereby malfunctions. Therefore, it is necessary to reduce a volume of the rush current to such a level that the noise from the power supply does not affect the operating circuit, and it thereby becomes necessary, in the power supply shutdown technology, to control a current flow in the power supply shutdown switch 1506.

When a volume of the current flow in the power supply shutdown switch 1506 is thus controlled, however, such an amount of time for shutting down the power or supplying the power as at least a few µs becomes necessary. This becomes a bottleneck in the pursuit of increasing a system operation speed. FIGS. 19A and 19B illustrate waveforms of a power supply and a waveform of an operation clock at the time of the power supply and power shutdown according to the conventional power supply shutdown technology. FIG. 19A illustrates the operation clock waveform in a slow transient operation in which a few µs of transition time at the time of the power supply and power shutdown is secured in order to control the power supply noise, while FIG. 19B illustrates power supply waveforms VSSV1 and VSSV2 of the pseudo ground power supplies 1507 and 1508 and an operation clock waveform BCLK of the first and second circuit blocks 1503 and 1504 in a fast transient operation in which the transition time at the time of the power supply and power shutdown is reduced to such a level as ns order. FIGS. 19A and 19B illustrate the waveforms in a state where in the circuit block 1503, the power supply/power shutdown is controlled and the circuit block 1504 is an always-ON block and thereafter the circuit blocks 1503 and 1504 are both under operating condition. Further, FIG. 19A illustrates the waveforms in the case where the few µm of transition time at the time of the power supply/power shutdown in the first circuit block 1503 is secured, while FIG. 19B illustrates the waveforms in the case where the transition time at the time of the power supply and power shutdown in the first circuit block 1503 is shortened to such a level as ns order.

As illustrated in FIG. 19A, when an adequate amount of transition time at the time of the power supply and power shutdown is secured, the noise is not generated in the ground power supply 1502 and the pseudo ground power supplies VSSV1 and VSSV2 as well as the first and second circuit blocks 1503 and 1504, but the system operation speedup is hindered.

As illustrated in FIG. 19B, when the transition time at the time of the power supply/power shutdown is shortened, a large noise is generated from the power supply during the transition due to the rush current. Such a power supply noise largely affects the operation of the second circuit block 1504 under operating conditions, resulting in a malfunction of the second circuit block 1504 in the worst case.

The Patent Documents 1 and 2 shown below disclosed a technology wherein the transition time at the time of the power supply and power shutdown is finely adjusted, and a technology wherein the transition time is simply sped up without referring to the noise problem. However, they did not disclose a technology which prevents a generated noise from affecting the circuit under operating conditions.

The Patent Document 3 shown below describes a proposed structure as follows: when the detecting unit detects a functional restart of a functional block in abeyance, a clock signal control unit stops the supply of a clock signal to a functional block under operating conditions during the output period of the predetermined number of clock cycles, and a power supply control unit supplies power to the functional block in abeyance during the clock signal supply stoppage period.

Patent Document 1: H07-264775 of the Japanese Patent Applications Laid-Open
Patent Document 2: H09-321600 of the Japanese Patent Applications Laid-Open
Patent Document 3: US2007/0038876A1

DISCLOSURE OF THE INVENTION

Problem to be Solved by the Invention
The conventional power supply shutdown technologies recited in the Patent Documents 1 and 2 are effective in reducing the leak current of LSI. However, even when these technologies are applied to a plurality of blocks, it is difficult to eliminate the power supply noise due to the rush current and improve the processing speed. Although some approaches were proposed to eliminate the power supply noise due to the rush current and improve the processing speed, it is fair to say that they are not effective enough. The conventional power supply shutdown technology recited in the Patent Document 3 is not highly effective in eliminating the power supply noise.

Means for Solving the Problem

A semiconductor integrated circuit according to the present invention comprises:

a first circuit block connected to a power supply wire or a ground wire;

a second circuit block connected to the power supply wire or the ground wire to which the first circuit block is connected;

a power supply potential detecting circuit for detecting a power supply potential of the second circuit block when the first circuit block shifts from a power supply shutdown state to a power supply feeding state or shifts from the power supply feeding state to the power supply shutdown state; and an operation control circuit for temporarily stopping a function of the second circuit block when the first circuit block shifts from the power supply shutdown state to the power supply feeding state or shifts from the power supply feeding state to the power supply shutdown state and then recovering the function of the second circuit block based on a detection result outputted from the power supply potential detecting circuit.

A semiconductor integrated circuit according to the present invention comprises:

a first circuit block connected to a power supply wire or a ground wire;

a second circuit block connected to the power supply wire or the ground wire to which the first circuit block is connected;

an operation control circuit for temporarily stopping a function of the second circuit block when the first circuit block shifts from a power supply shutdown state to a power supply feeding state or shifts from the power supply feeding state to the power supply shutdown state and then recovering the function of the second circuit block;

a first power supply shutdown switch for disconnecting the first circuit block from the power supply wire or the ground wire when the first circuit block is in a non-operating state; and a delay adjusting circuit for adjusting a length of time when the first circuit block is connected to or disconnected from the power supply wire or the ground wire using the first power supply shutdown switch.

According to the constitutions, the operation of the semiconductor integrated circuit can be accurately controlled in accordance with such variable factors as a voltage value of the power supply, an environmental temperature at which the semiconductor integrated circuit is set, and a wiring impedance of the power supply in the implementation of the semiconductor integrated circuit.

A semiconductor integrated circuit according to the present invention comprises:

a first circuit block connected to a ground wire;

a second circuit block connected to the ground wire to which the first circuit block is connected;

a first power supply for feeding power to the first circuit block;

a second power supply for feeding power to the second circuit block; and an operation control circuit for temporarily stopping a function of the second circuit block when the first circuit block shifts from a power supply shutdown state to a power supply feeding state or shifts from the power supply feeding state to the power supply shutdown state and then recovering the function of the second circuit block, wherein the first and second power supplies independently feed different power supply potentials to power supply destinations thereof.

According to the constitution, when a voltage of the second power supply is increased to a level higher than a voltage of the first power supply, noise-resistant performance is improved, and a faster switching response is thereby achieved.

According to a preferable mode of the present invention, the operation control circuit recovers the function of the second circuit block when it is judged based on the outputted detection result that the power supply potential of the second circuit block is stabilized.

According to another preferable mode of the present invention, the semiconductor integrated circuit further comprises a storage circuit for storing input data to be inputted to the second circuit block, wherein the operation control circuit temporarily stops the function of the second circuit block after the input data of the second circuit block is stored in the storage circuit, and the second circuit block reads the input data from the storage circuit when the function is recovered.

In this preferable mode, the semiconductor integrated circuit preferably further comprises:

a first power supply for feeding power to the first circuit block;

a second power supply for feeding power to the second circuit block; and a third power supply for feeding power to the storage circuit, wherein the first, second and third power supplies independently feed different power supply potentials to power supply destinations thereof.

Accordingly, the data can be stored under a different power supply voltage, which improves a data retaining tolerance.

According to still another preferable mode of the present invention, the semiconductor integrated circuit further comprises a timer circuit for counting a stoppage period of the second circuit block.

According to still another preferable mode of the present invention, the semiconductor integrated circuit further comprises:

a first power supply for feeding power to the first circuit block; and a second power supply for feeding power to the second circuit block, wherein the first and second power supplies independently feed different power supply potentials to power supply destinations thereof.

According to the constitution, the power supply voltage to be fed to the second circuit block by the second power supply are preferably set to be higher than the power supply voltage to be fed to the first circuit block by the first power supply.

Accordingly, the noise-resistant performance can be improved when the voltage of the second power supply is set to be higher than that of the first power supply, and fast switching response can be thereby realized.

According to still another preferable mode of the present invention, the delay adjusting circuit adjusts a length of time during which the first circuit block is connected to or disconnected from the power supply wire or the ground wire so that the shift of a connection state between the first circuit block and the power supply wire or the ground wire is completed before the shift of a power supply state of the second circuit block is completed by the operation control circuit.

As described so far, according to the present invention, when the first circuit block in the non-operating state is disconnected from the ground wire by the power supply shutdown switch, the potential of the pseudo ground power supply is increased to a level as high as the potential of the power supply based on the proportion of the leak current of the first circuit block to the leak current of the power supply shutdown switch. As a result, the leak current of the first circuit block is controlled, and power consumption is thereby largely cut down.

Further, in the semiconductor integrated circuit comprising the operation control circuit which stops the function of the second circuit block when the power supply state of the first circuit block is shifted, the power supply noise due to the rush current against the second circuit block, which occurs as the power supply state is shifted in a shorter period of time, can be prevented. As a result, the circuit under operating conditions can be prevented from malfunctioning.

Furthermore, the operation of the semiconductor integrated circuit can be accurately controlled in accordance with such variable factors as the power supply voltage value, the environmental temperature at which the semiconductor integrated circuit is set, and the impedance of the power supply wire in the implementation of the semiconductor integrated circuit.

Further, the switching response can be accelerated since the noise resistance is improved.

The semiconductor integrated circuit according to the present invention is preferably incorporated in a communication device which controls the operating or non-operating state of circuit blocks in response to radio wave, audio signals, video signals, keyboard input signals, signals from a storage device for storing data (hard disc device or the like), and the like.

The semiconductor integrated circuit according to the present invention is preferably incorporated in an information reproducing device which controls the operating or non-operating state of circuit blocks in response to radio wave, audio signals, video signals, infrared input signals, signals from a storage device for storing data, and the like.

The semiconductor integrated circuit according to the present invention is preferably incorporated in an image display device which controls the operating or non-operating state of circuit blocks in response to radio wave, audio signals, video signals, infrared input signals, signals from a storage device for storing data, and the like.

The semiconductor integrated circuit according to the present invention is preferably incorporated in an electronic device which controls the operating or non-operating state of circuit blocks in response to radio wave, audio signals, video signals, infrared input signals, signals from a storage device for storing data, and the like.

The semiconductor integrated circuit according to the present invention is preferably incorporated in an electronic control device which controls the operating or non-operating state of circuit blocks in response to radio wave, audio signals, video signals, infrared input signals, signals from a storage device for storing data, and the like.

The circuit block is not particularly restrictive, and any of a single logic circuit element, a plurality of logic circuit elements, a single device and a plurality of devices can constitute the circuit block.

Effect Of The Invention

The power supply shutdown technology which is effective in reducing the leak current of a circuit block in LSI has a major problem that the rush is generated as the power supply transition time at the time of the power shutdown or power supply is shortened and the power supply noise is consequently generated due to the rush current.

The present invention has solved the problem in the following way:
 the generation of the power supply noise is controlled; or
 the circuit block under operating conditions is prevented from malfunctioning even if the power supply noise is generated.

Furthermore, according to the present invention, it becomes possible to control the operation of the semiconductor integrated circuit accurately in accordance with such variable factors as a power supply voltage value, the environmental temperature at which the semiconductor integrated circuit is set, and the impedance of a power supply wire in the implementation of the semiconductor integrated circuit, and thereby the control accuracy of the operation improves.

BRIEF DESCRIPTION OF THE DRAWINGS

FIG. 1 is a circuit diagram of a semiconductor integrated circuit according to a preferred embodiment 1 of the present invention.

FIG. 4 is a timing chart illustrating an operation of the semiconductor integrated circuit according to the preferred embodiment 1.

FIG. 5B is a timing chart illustrating an operation of the semiconductor integrated circuit according to the modified embodiment.

FIG. 8 is a schematic perspective view of a mobile telephone which is an example of a communication device in which the semiconductor integrated circuit according to the present invention is incorporated.

FIG. 16 is a schematic perspective view of an automobile which is an example of a mobile object in which the semiconductor integrated circuit according to the present invention is incorporated.

FIG. 17 is a block diagram illustrating a constitution of main structural components of the automobile in which the semiconductor integrated circuit according to the present invention is incorporated.

FIG. 18 is a circuit diagram illustrating conventional power supply shutdown control.

FIG. 19A is a drawing which illustrates a potential variation of a pseudo ground power supply according to a first conventional technology.

FIG. 19B is a drawing which illustrates a potential variation of a pseudo ground power supply according to a second conventional technology.

Figure 2:
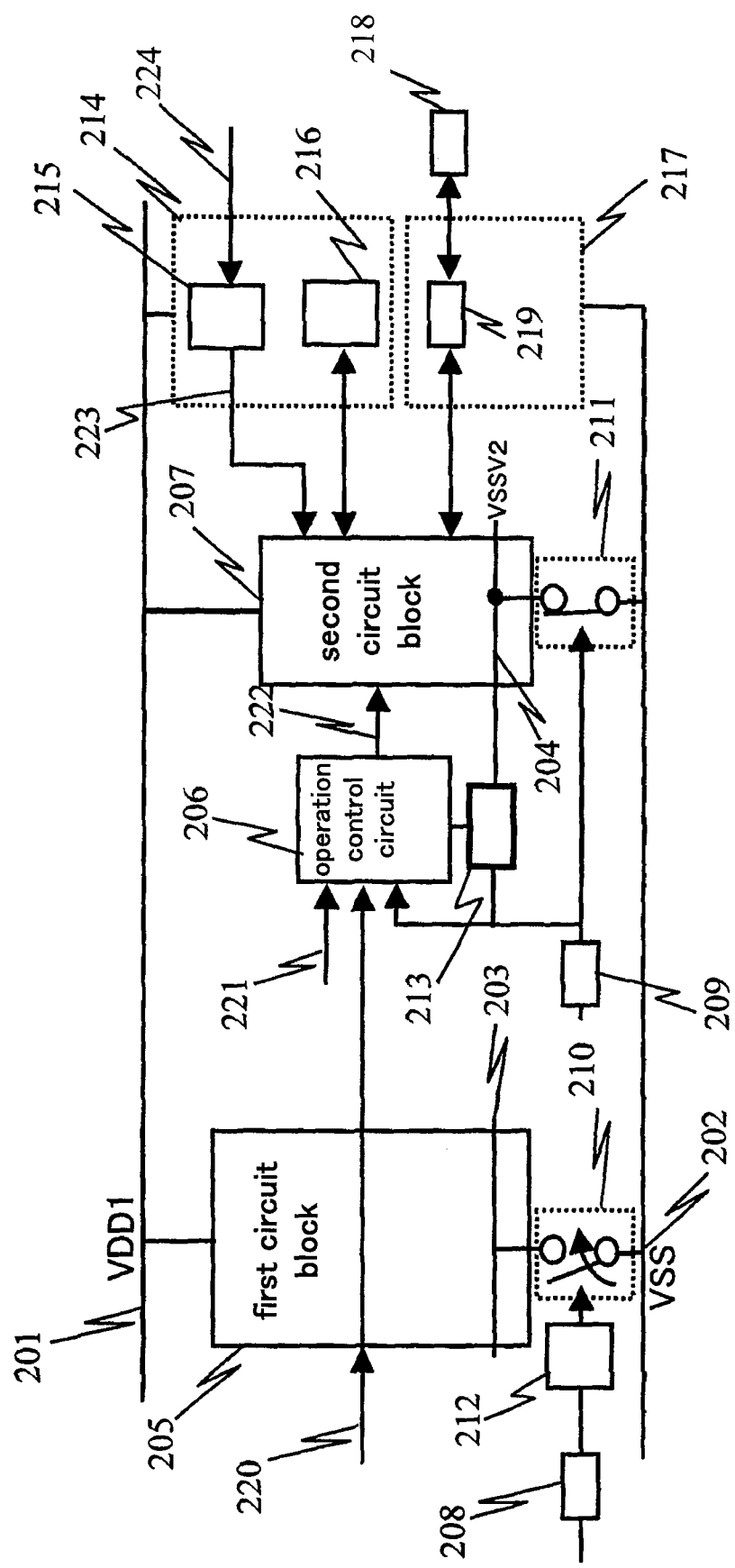
FIG. 2 is a circuit diagram of a semiconductor integrated circuit according to a preferred embodiment 2 of the present invention.

DESCRIPTION OF REFERENCE SYMBOLS 101 power supply
102 ground power supply
103 pseudo ground power supply (VSSV1)
104 first circuit block
105 second circuit block
106 operation control circuit
107 first power supply shutdown switch control circuit
108 first power supply shutdown switch
109 first circuit block control signal
110 second circuit block control signal
111 operation control signal (STREQ)
112 second power supply shutdown switch control circuit
113 second power supply shutdown switch
114 pseudo ground power supply (VSSV2)

PREFERRED EMBODIMENTS OF THE INVENTION

Hereinafter, preferred embodiments of the present invention are described in detail referring to the drawings.

Preferred Embodiment 1

FIG. 1 is an illustration of a preferred embodiment 1 of the present invention which represents the most simplified constitution according to the present invention. A semiconductor integrated circuit according to the preferred embodiment comprises a first circuit block 104, a second circuit block 105 connected to a power supply 101 and a ground power supply 102 to which the first circuit block 104 is also connected, a first power supply shutdown switch control circuit 107, a second power supply shutdown switch control circuit 112, a first power supply shutdown switch 108, and a second power supply shutdown switch 113. The semiconductor integrated circuit further comprises an operation control circuit 106 for stopping a function of the second circuit block 105 when the first circuit block 104 shifts to a power supply shutdown state or a power supply feeding state. Below is given a further detailed description.

The first circuit block 104 is connected to between the power supply 101 and the ground power supply 102 by way of the first power supply shutdown switch 108. A plurality of NMOS transistors constitute the first power supply shutdown switch 108. The first power supply shutdown switch 108 is turned on and off by the first power supply shutdown switch control circuit 107. The second circuit block 105 is connected to between the power supply 101 and the ground power supply 102, to which the first circuit block 104 is also connected, by way of the second power supply shutdown switch 113. The power supply 101 feeds power to the first circuit block 104 and the second circuit block 105.

The first power supply shutdown switch 108 is controlled by the first power supply shutdown switch control circuit 107 and is turned on when the first circuit block 104 is in an operating state and turned off when the first circuit block 104 is in a non-operating state. Thus, the first power supply shutdown switch 108 is turned off when the first circuit block 104 is in the non-operation state, and the first circuit block 104 is thereby electrically disconnected from the ground power supply 102. Accordingly, a potential of the pseudo ground power supply 103 is increased to a level as high as a power supply potential of the power supply 101 in accordance with a proportion of a leak current of the first circuit block 104 to a leak current of the power supply shutdown switch 108. As a result, the leak current in the case where the power supply is shut down can be largely reduced in comparison to the leak current generated in the case where the power supply is not shut down (at rest).

When the first circuit block 104 shifts from the power supply feeding state to the power supply shutdown state or from the power supply shutdown state to the power supply feeding state, the potential of the pseudo ground power supply 103 changes, and the operation control circuit 106 controls the stoppage/start of the operation of the second circuit block 105 while the potential is changing.

In the constitution according to the preferred embodiment 1 described above, the first and second power supply shutdown switches 108 and 113 are connected on the side of the ground power supply 102. Alternatively, PMOS transistor switches may constitute the first and second power supply shutdown switches 108 and 113 and these switches may be connected on the side of the power supply 101. Moreover, the first and second power supply shutdown switches 108 and 113 may be connected on both sides of the power supply 101 and the ground power supply 102.

FIG. 4 is an illustration of a control sequence and power supply waveforms according to the preferred embodiment 1. A reference symbol VSSV1 illustrated in FIG. 4 denotes the potential of the pseudo ground power supply 103 in the first circuit block 104, VSSV2 denotes the potential of the pseudo ground power supply 114 in the second circuit block 105, STREQ denotes an operation control signal 111 which is inputted from the operation control circuit 106 to the second circuit block 105 to control the stoppage/start of the operation of the second circuit block 105, and BCLK denotes a clock signal of a synchronous circuit in the second circuit block 105.

Period up to Time Point TS1

During this period, the first power supply shutdown switch 108 is in ON state, and the potential of the ground power supply 102 is fed to the pseudo ground power supply VSSV1 of the first circuit block 104. At the time, the first circuit block 104 and the second circuit block 105 are both under operating conditions.

Time Point TS1

On arriving at this time point, the first power supply shutdown switch 108 in ON state is switched to OFF state based on a first power supply shutdown control signal supplied from the first power supply shutdown switch control circuit 107, and the power supply to the first circuit block 104 is thereby shutdown. At this time point, the second circuit block 105 is under operating conditions. As illustrated in FIG. 4, the potential VSSV of the pseudo ground power supply 103 on the side of the first circuit block 104 at and after Time Point TS1 is increased to a level as high as the power supply potential of the power supply 101 in accordance with the proportion of the leak current of the first circuit block 104 to the leak current of the first power supply shutdown switch 108.

As illustrated with a broken line in FIG. 4, a slight amplitude variation occurs in the potential VSSV2 of the pseudo ground power supply 114 when and after the first circuit block 104 shifts from the power supply feeding state to the power supply shutdown state at Time Point TS1. However, the amplitude variation does not affect the operation of the second circuit block 105. The potential VSSV1 of the pseudo ground power supply 103 in the first circuit block 104 is increased to a level as high as the power supply potential of the power supply 101, and thereafter slightly changes based on the leak current as illustrated with the broken line in FIG. 4.

Period from Time Point TS2 to Time Point TS3

At and after Time Point TS2, the first power supply shutdown switch 108 is turned on in accordance with the first power supply shutdown control signal of the power supply shutdown switch control circuit 107, and accordingly the first circuit block 104 starts to shift from the power supply shutdown state to the power supply feeding state. A length of time during which the potential VSSV1 of the pseudo ground power supply 103 changes from the power supply potential of the power supply 101 to the ground potential of the ground power supply 102 affects an accuracy of the power supply potential. More specifically, in the case where the time length of the potential change is as short as ns order, a large-amplitude noise is generated based on the rush current as illustrated with the broken line in FIG. 4 and transmitted to the pseudo ground power supply 114. As a result, the accuracy of the power supply potential is deteriorated.

In the present preferred embodiment which focuses on the disadvantage, the operation of the second circuit block 105 under operating conditions is stopped based on the operation control signal (STREQ) 111 during the period from Time Point TS2 to Time Point TS3 so as to control the generation of the noise, thereby preventing it from affecting the circuit operation. In the preferred embodiment 1, the clock signal BCLK is halted as illustrated in FIG. 4 so that the second circuit block 105 is stopped. Accordingly, even if the power supply noise is generated by the rush current, the impact of the generated noise on the operating circuit can be prevented. In the description given above, the time length of the potential change was set to ns order, which is just an example of the time length.

In the foregoing description, of the period of the power supply shift in the first circuit block 104 after Time Point TS1 and the period of the shift from the power shutdown to the power supply after Time Point TS2, the operation of the second circuit block 105 is stopped based on the operation control signal 111 during the shifting period after Time Point TS2. The shifting period after Time Point TS2 is selected because the first circuit block 104 rapidly shifts from the shutdown state to the supply state during this shifting period; therefore, the change in the power supply potential during this shifting period is larger than any change detected in the power supply waveforms in other periods as illustrated in FIG. 4, and the power supply noise generated by the rush current to the operating second circuit block 105 is thereby increased. If the first circuit block 104 rapidly shifts in the shifting period from the power supply state to the power shutdown state, the operation of the second circuit block is preferably stopped by the operation control signal (STREQ) during this shifting period.

Figure 6A:
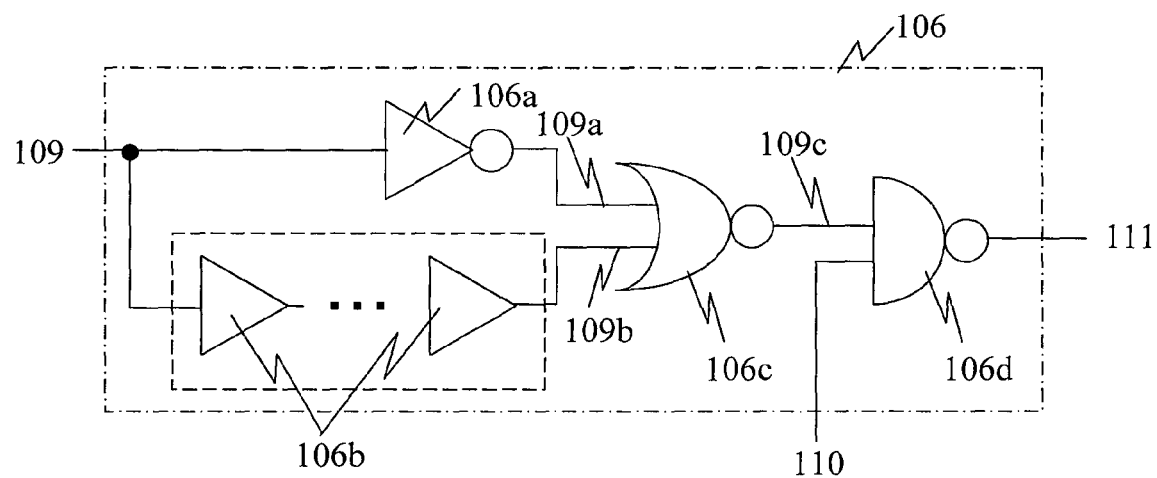
FIG. 6A is a circuit diagram illustrating an exemplified constitution of an operation control circuit in the semiconductor integrated circuit according to the present invention.

The operation control signal 111 (STREQ) is generated in the operation control circuit 106, for example, as follows. As illustrated in FIG. 6A, the operation control circuit 106 comprises an NOT circuit 106a, a group of delay elements 106b . . . , an NOR circuit 106c and an NAND circuit 106d. To the operation control circuit 106 thus constituted are inputted a control signal 109 of the first circuit block 104 (first circuit block control signal) and a control signal 110 of the second circuit block 105 (second circuit block control signal).

Figure 6B:
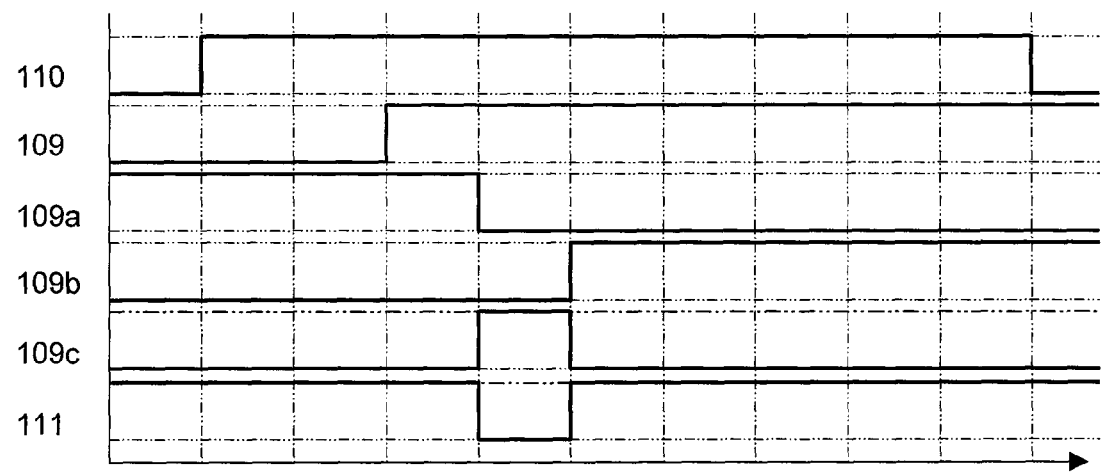
FIG. 6B is a timing chart illustrating an operation of the operation control circuit.

As illustrated in FIG. 6B, in the operation control circuit 106:

the first circuit block control signal 109 is logically inverted in the NOT circuit 106a, so that a control signal 109a is generated;

the first circuit block control signal 109 is delayed by a predetermined length of time in the group of delay elements 106b . . . , so that a control signal 109b is generated;

a NOT-OR operation is performed based on the control signal 109a and the control signal 109b in the NOR circuit 106c, so that a control signal 109c is generated; and a NOT-BOTH operation is performed based on the control signal 109c and the second circuit block control signal 110 in the NAND circuit 106d, so that the operation control signal (STREQ) 111 is generated.

In the operation control circuit 106 which thus generates the operation control signal (STREQ) 111, delay amounts by the group of delay elements 106b, . . . are adjusted (element quantities of the delay elements 106b serially connected to each other are adjusted), so that an amount of time for controlling the operation of the second circuit block 105 can be very accurately adjusted.

Figure 5A:
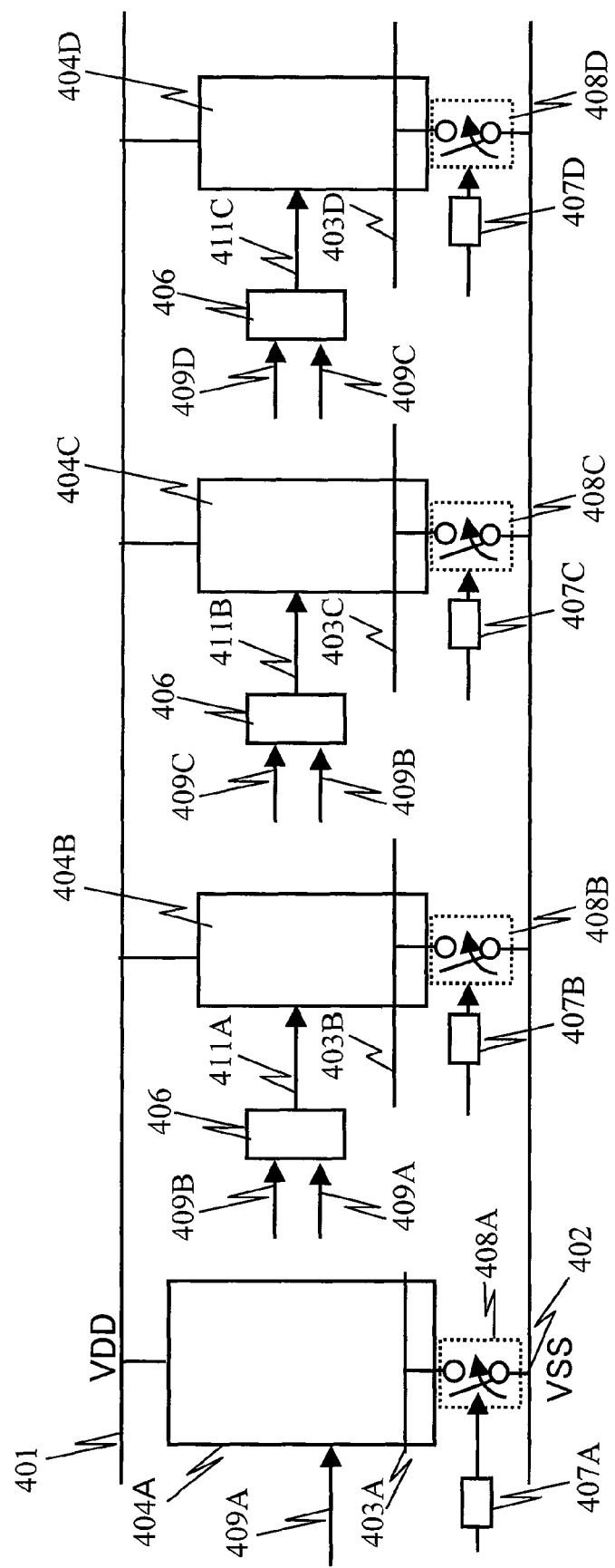
FIG. 5A is a circuit diagram of a semiconductor integrated circuit according to a modified embodiment of the present invention.

In the preferred embodiment 1, the present invention was carried out in the circuit configuration comprising the two circuit blocks which were the first circuit block 104 and the second circuit block 105. However, the present invention can be similarly carried out in a circuit configuration comprising more than two circuit blocks. In FIG. 5A, a circuit configuration comprising first-fourth circuit blocks is illustrated. In FIG. 5B, an operation timing in the configuration illustrated in FIG. 5A is illustrated. In FIGS. 5A and 5B, a reference numeral 401 denotes a power supply, 402 denotes a ground power supply, 403A-403D denote first-fourth pseudo ground power supplies, 404A-404D denote first-fourth circuit blocks, 407A-407D denote first-fourth power supply shutdown switch control signals, 408A-408D denote first-fourth power supply shutdown switches, 409A-409D denote first-fourth circuit block control signals, and 411A-411C denote second-fourth circuit block operation control signals.

Either a single logic circuit element or a plurality of logic circuit elements may constitute each of the circuit blocks 404A-404D. Further, either a single device or a plurality of devices may constitute each of the circuit blocks 404A-404D.

Preferred Embodiment 2

FIG. 2 is an illustration of a preferred embodiment 2 of the present invention. A basic structure and control method according to the preferred embodiment 2 are the same as those of the preferred embodiment 1. However, a first difference of the preferred embodiment 2 from the preferred embodiment 1 is that a power supply potential detecting circuit 213 for detecting a potential of a pseudo ground power supply 204 in a second circuit block 207 under operating conditions is provided.

The power supply potential detecting circuit 213 generates a detection signal at a time point when the potential of the pseudo ground power supply 204 is stabilized and supplies the generated detection signal to an operation control circuit 206. The operation control circuit 206 which received the detection signal generates an operation control signal 222 and supplies the generated operation control signal 222 to the second circuit block 207. The second circuit block 207 which received the operation control signal 222 shifts from an operation-stop state to an operation-start state. Accordingly, the operation of the semiconductor integrated circuit can be accurately controlled in accordance with such variable factors as a power supply voltage value, an environmental temperature at which the semiconductor integrated circuit is set, and the impedance of a power supply wire in the implementation of the semiconductor integrated circuit. As a result, the operation of the second circuit block 207 is stabilized (in other words, the operation is guaranteed), and an amount of time necessary for the control operation can be reduced to the minimum.

A second difference of the preferred embodiment 2 from the preferred embodiment 1 is that a storage circuit 214 for storing input data of the second circuit block 207 is provided. Input data 224 is retained in a latch circuit 215 or a memory circuit 216 in the storage circuit 214 before the second circuit block 207 is requested to stop its operation. When the second circuit block 207 once stops and then recovers its operation, the input data 224 is not inputted again but restored from the storage circuit 214. Accordingly, a recovery time is reduced, and thereby the reduction in a throughput by the stoppage period of the second circuit block 207 can be prevented.

A third difference of the preferred embodiment 2 from the preferred embodiment 1 is that a timer circuit 217 for counting a length of time during which the operation of the second circuit block 207 is stopped is provided. The timer circuit 217 comprises a sub timer circuit 219 for managing an operation stoppage period and manages the operation stoppage period of the second circuit block 207 using the sub timer circuit 219. Accordingly, a count value of a main timer circuit 218 can be corrected based on a count value of the operation stoppage period managed by the timer circuit 217, and the function characterized by the present invention can be further stabilized.

Figure 7A:
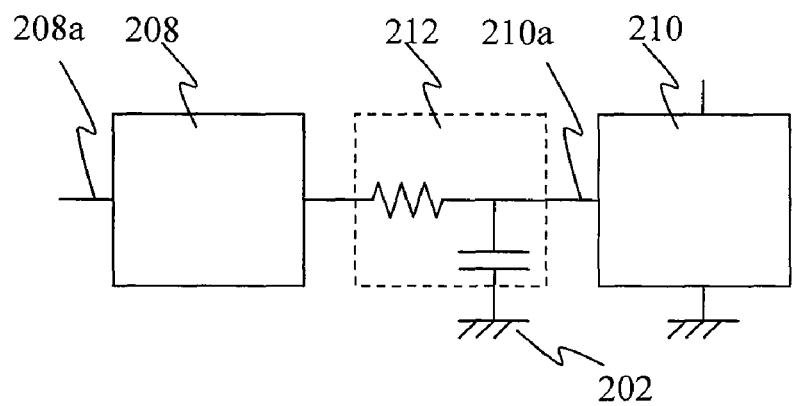
FIG. 7A is a circuit diagram illustrating an exemplified constitution of a delay adjusting circuit in the semiconductor integrated circuit according to the present invention.
Figure 7B:
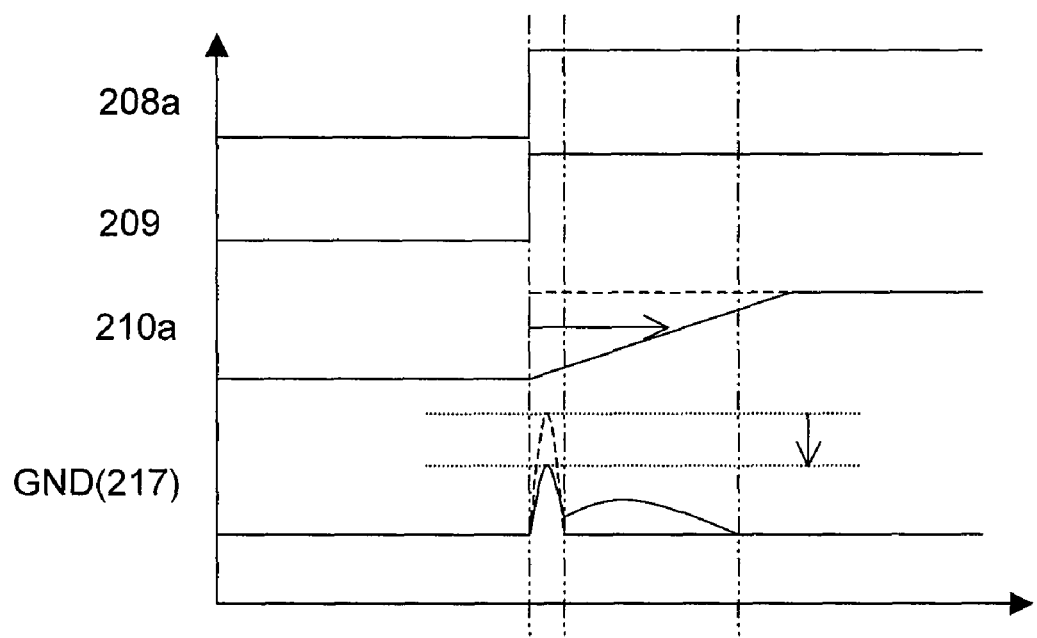
FIG. 7B is a timing chart illustrating an operation of the delay adjusting circuit.

A fourth difference of the preferred embodiment 2 from the preferred embodiment 1 is that a delay adjusting circuit 212 for adjusting an ON/OFF time of a first power supply shutdown switch 210 of a first circuit block 205 is provided. A CR circuit, for example, constitutes the delay adjusting circuit 212 as illustrated in FIG. 7A. As illustrated in a timing chart of FIG. 7B, the delay adjusting circuit 212 generates a control signal 210a by depressing the rise of a waveform of a control signal 208a outputted by a first power supply shutdown switch 208 which controls the ON/OFF time of the first power supply shutdown switch 210, and supplies the control signal 210a to the first power shutdown switch 210. Accordingly, the ON/OFF time of the first power supply shutdown switch 210 is adjusted so that the power supply can be shutdown or fed to the first circuit block 205 by the time when the operation of the second circuit block 207 is stopped or recovered. As a result, the operation of the semiconductor integrated circuit can be controlled in such a manner that the operation can adequately respond to such variable factors as the impedance of a power supply wire in the implementation of the semiconductor integrated circuit, and a system operation can be thereby stabilized (in other words, the operation can be guaranteed). Further, the amount of time necessary for the control operation can be reduced to the minimum.

According to the preferred embodiment 2, the power supply shutdown switches are connected on the side of the ground power supply 202. Alternatively, PMOS transistors switches may constitute the power supply shutdown switches, and these switches can be provided on the side of the power supply 201. Further, the power supply shutdown switches may be connected on both sides of the power supply 201 and the ground power supply 202. In the preferred embodiment 2, the two blocks are provided. The present invention can be carried out in a configuration comprising at least three circuits as described in the preferred embodiment 1, wherein a similar control operation can be achieved. Either a single logic circuit element or a plurality of logic circuit elements may constitute the circuit block. Further, either a single device or a plurality of devices may constitute the circuit block.

Preferred Embodiment 2

Figure 3:
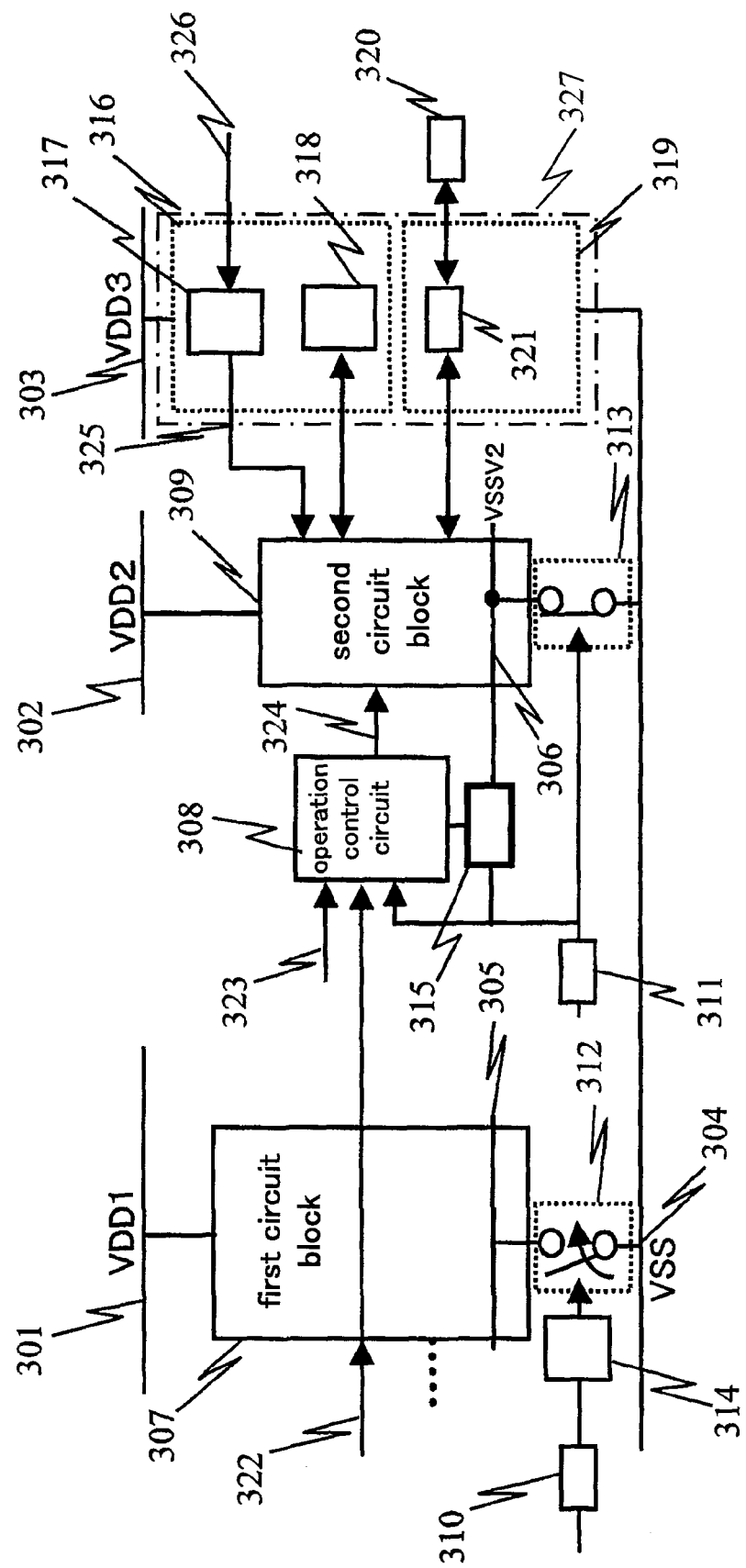
FIG. 3 is a circuit diagram of a semiconductor integrated circuit according to a preferred embodiment 3 of the present invention.

FIG. 3 is an illustration of a preferred embodiment 3 of the present invention. A basic structure and control method according to the preferred embodiment 3 are the same as those of the preferred embodiments 1 and 2. However, the preferred embodiment 3 is different to the preferred embodiments 1 and 2 in that a first power supply 301 for feeding power to a first circuit block 307, a second power supply 302 for feeding power to a second circuit block 309 and a third power supply 303 for feeding power to a circuit block in which a more stable operation than in the first and second power supplies 301 and 302 is demanded (hereinafter, referred to as a third circuit block 327) are provided so that potentials different to one another can be independently supplied to the first through third circuit blocks 307, 309 and 327.

The third circuit block 327 comprises a register circuit 317 (for storing input data 326), a storage circuit 316 (provided with a memory circuit 318), a timer circuit 319 (provided with a sub timer circuit for managing an operation stoppage time of the second circuit block 309 aside from a main timer circuit 320), and the like. The third circuit block 327 thus constituted has a structure and a function which are similar to those according to the preferred embodiment 2.

According to the present preferred embodiment 1, even if the potential supplied from the second power supply 302 is set to have a lower voltage than that of the first power supply 301 during the stoppage period of the second circuit block 309, a voltage sufficient enough to retain data of the second circuit block 309 can still be adequately supplied from the second power supply 302. Moreover, a higher-voltage potential independent from the first power supply 301 and the second power supply 302 can be supplied to the third circuit block 327 comprising the storage circuit 316, the timer circuit 319 and the like in which a more stable operation is demanded.

Accordingly, the following advantages can be enjoyed:
the data retention by the storage circuit 316 can be surely guaranteed; and
the timer circuit 319 can be controlled in such an accurate manner that any impacts of the noise are eliminated.

Moreover, when the potential supplied from the second power supply 302 is set to have a higher voltage than that of the first power supply 301, the second circuit block 309 can become more noise-resistant, as a result of which the switching response can be accelerated.

In the preferred embodiment 3, a delay adjusting circuit 314 for adjusting an ON/OFF time of the first power supply shutdown switch 312 in the first circuit block 307 is provided as in the case of the preferred embodiment 2.

The preferred embodiment 3 is characterized in that the power supply shutdown switches are connected on the side of the ground power supply 314. However, PMOS transistor switches may constitute the power supply shutdown switches, and these switches can be provided on the side of the first power supply 301 or the second power supply 302. In that case, the ground-side power supply is configured to be independently controllable.

In the preferred embodiment 3, the present invention was carried out in the circuit configuration comprising the first and second circuit blocks 307 and 309. However, a similar control operation can be obtained in the case where the present invention is carried out in a configuration comprising at least three circuit blocks as described in the preferred embodiments 1 and 2. Either a single logic circuit element or a plurality of logic circuit elements may constitute the circuit block. Further, either a single device or a plurality of devices may constitute the circuit block.

Application Examples

Next, examples of the application of the semiconductor integrated circuit of the present invention are described. FIG. 8 is a schematic illustration of a mobile telephone which is an example of a communication device provided with the semiconductor integrated circuit according to the present invention. A mobile telephone 501 comprises a base band LSI 502 and an application LSI 1503. Each of the base band LSI 502 and the application LSI 1503 is a circuit block, and whether these circuit blocks are operated or not operated is determined based on a wireless signal or a wired signal received by way of a high-frequency transmission/reception interface unit and an external input interface unit.

The semiconductor integrated circuit according to the present invention may be used as any logic circuit provided in the semiconductor integrated circuit other than the base band LSI 502 and the application LSI 503 provided in the mobile telephone 501, in which case a similar effect can be achieved.

Figure 9:
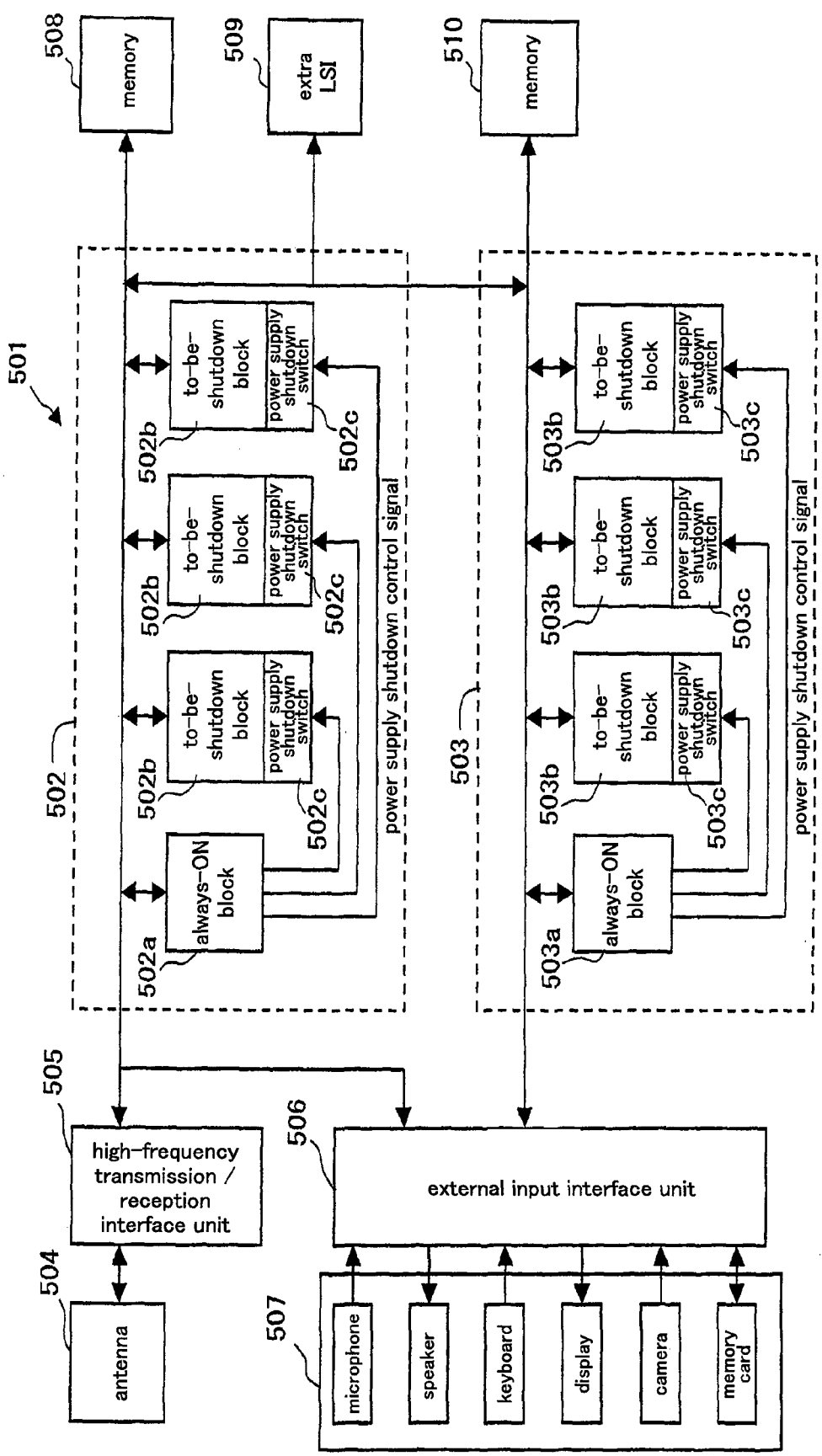
FIG. 9 is a block diagram illustrating a constitution of the mobile telephone in which the semiconductor integrated circuit according to the present invention is incorporated.

FIG. 9 is a block diagram illustrating a constitution of the mobile telephone in which the semiconductor integrated circuit according to the present invention is incorporated. In the illustration of FIG. 9, structural components are simply shown with their component names, and will not be described in detail. The base band LSI 502 is a circuit block which is a basic component in the communication device, and the application LSI 503 is a circuit block which constitutes an application of the communication device. The base band LSI 502 comprises an always-ON block 502*a*, a to-be-shutdown block 502*b* and a power supply shutdown switch block 502*c*. The always-ON block 502*a* is a circuit block whose power supply cannot be shut down. The to-be-shutdown block 502*b* is a circuit block whose power supply can be shut down. The power supply shutdown switch block 502*c* is a circuit block which determines whether the power supply to the to-be-shutdown block 502*b* is or is not shutdown. In the structure illustrated in FIG. 9, the to-be-shutdown block 502*b* corresponds to the first circuit blocks 104, 205 and 307 and the like according to the preferred embodiments 1-3 (FIGS. 1-5B). In the case where a constitution where the second power supply shutdown switches 113, 211 and 313 are removed from the second circuit blocks 105, 207 and 309 according to the preferred embodiments 1-3 (FIGS. 1-7) is incorporated in the structure illustrated in FIG. 9, the second circuit blocks 105, 207 and 309 and the circuit block comprising the operation control circuits 106, 206 and 308, potential detecting circuits 213 and 315, storage circuits 214 and 316 and timer circuits 217 and 319 which are relevant to the second circuit blocks are included in the always-ON block 502*a*.

On the other hand, in the case where the constitutions of the second circuit blocks 105, 207 and 309 according to the preferred embodiments 1-3 (FIGS. 1-7, including the second power supply shutdown switches 113, 211 and 313) are incorporated in the structure illustrated in FIG. 9, the second circuit blocks 105, 207 and 309 and the circuit block comprising the operation control circuits 106, 206 and 308, potential detecting circuits 213 and 315, storage circuits 214 and 316 and timer circuits 217 and 319 which are relevant to the second blocks are included in the to-be-shutdown block 502*b*. The delay adjusting circuits 212 and 314 illustrated in FIGS. 2 and 3, the first power supply shutdown switches 108, 210 and 304 illustrated in FIGS. 1-3, and the like, are included in the power supply shutdown switch block 502*c*.

The application LSI 503 comprises an always-ON block 503*a*, a to-be-shutdown block 503*b* and a power supply shutdown switch block 503*c*. In the base band LSI 502 and the application LSI 503, the always-ON blocks 502*a* and 503*a*, to-be-shutdown blocks 502*b* and 503*b* and power supply shutdown switches 502*c* and 503*c* are constituted as described in the respective embodiments.

Referring to reference numerals shown in FIG. 9, 504 denotes an antenna, 505 denotes a high-frequency transmission/reception interface unit, 506 denotes an external input interface unit, 507 denotes a function unit for executing various functions (audio input function, audio output function, keyboard input recognizing function, display function, camera function, memory card input/output function, and the like), 508 denotes a memory, 509 denotes an extra LSI, and 510 denotes a memory.

Whether the respective circuit blocks provided in the base band LSI 502 and the application LSI 503 are operated or not operated is determined based on a wireless signal or a wired signal received by way of the high-frequency transmission/reception interface unit 505 and the external input interface unit 506.

The control operation according to the present invention in the base band LSI 502 illustrated in FIG. 9 is executed periodically based on the recognition of a timer in the base band LSI 502 or executed based on a high-frequency signal inputted from the antenna 504 or an input result of the function unit 507 obtained by way of the keyboard and the like. The operation according to the present invention in the application LSI 503 is executed based on an input result of the function unit 507 (keyboard or the like).

In FIG. 9, an example of the communication device in which the semiconductor integrated circuit according to the present invention is incorporated is illustrated. The functions of the mobile telephone 501 are not necessarily limited to those described above, and other functions can be added or the constitution may be altered unless any system failure thereby occurs. Further, the functions included in the respective LSIs may be variously altered as far as they can be integrated.

The communication device comprising the semiconductor integrated circuit according to the present invention is not necessarily limited to a mobile telephone, and can include, for example, a transmitter and a receiver in a communication system and a modem device for transmitting and receiving data other than a mobile telephone. The present invention is effective in reducing reduce power consumption in all kinds of communication devices regardless of whether they are wired or wireless devices or optical communication or electric communication devices, or whether a digital system or an analogue system is adopted therein.

Figure 10:
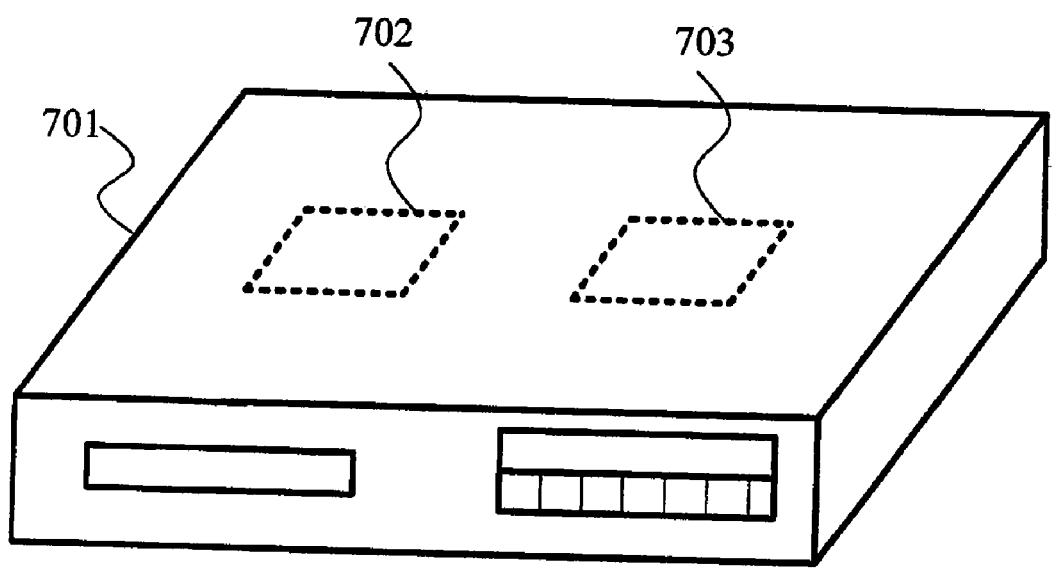
FIG. 10 is a schematic perspective view of an optical disc device which is an example of an information reproducing device in which the semiconductor integrated circuit according to the present invention is incorporated.

FIG. 10 is a schematic illustration of an optical disc device which is an example of an information reproducing device in which the semiconductor integrated circuit according to the present invention is provided. An optical disc device 701 comprises a media signal processing LSI 702 for processing a signal read from an optical disc not shown, and an error correction/servo processing LSI 703 for correcting an error of the signal and executing servo control of an optical pickup. The media signal processing LSI 702 and the error correction/servo processing LSI 703 are constituted in the same manner as the semiconductor integrated circuits according to the preferred embodiments described so far.

The semiconductor integrated circuit according to the present invention can be operated with less power consumption in comparison to the conventional semiconductor integrated circuits. Therefore, the media signal processing LSI 702 and the error correction/servo processing LSI 703 comprising the semiconductor integrated circuit according to the present invention and the optical disc device 701 comprising these LSIs can also be operated with less electric power. Further, in any LSI provided in the optical disc device 701 other than the media signal processing LSI 702 and the error correction/servo processing LSI 703, the semiconductor integrated circuit according to the present invention can be used as a logic circuit provided in the LSI. As a result, a similar effect (operation with less electric power) can be exerted.

Figure 11:
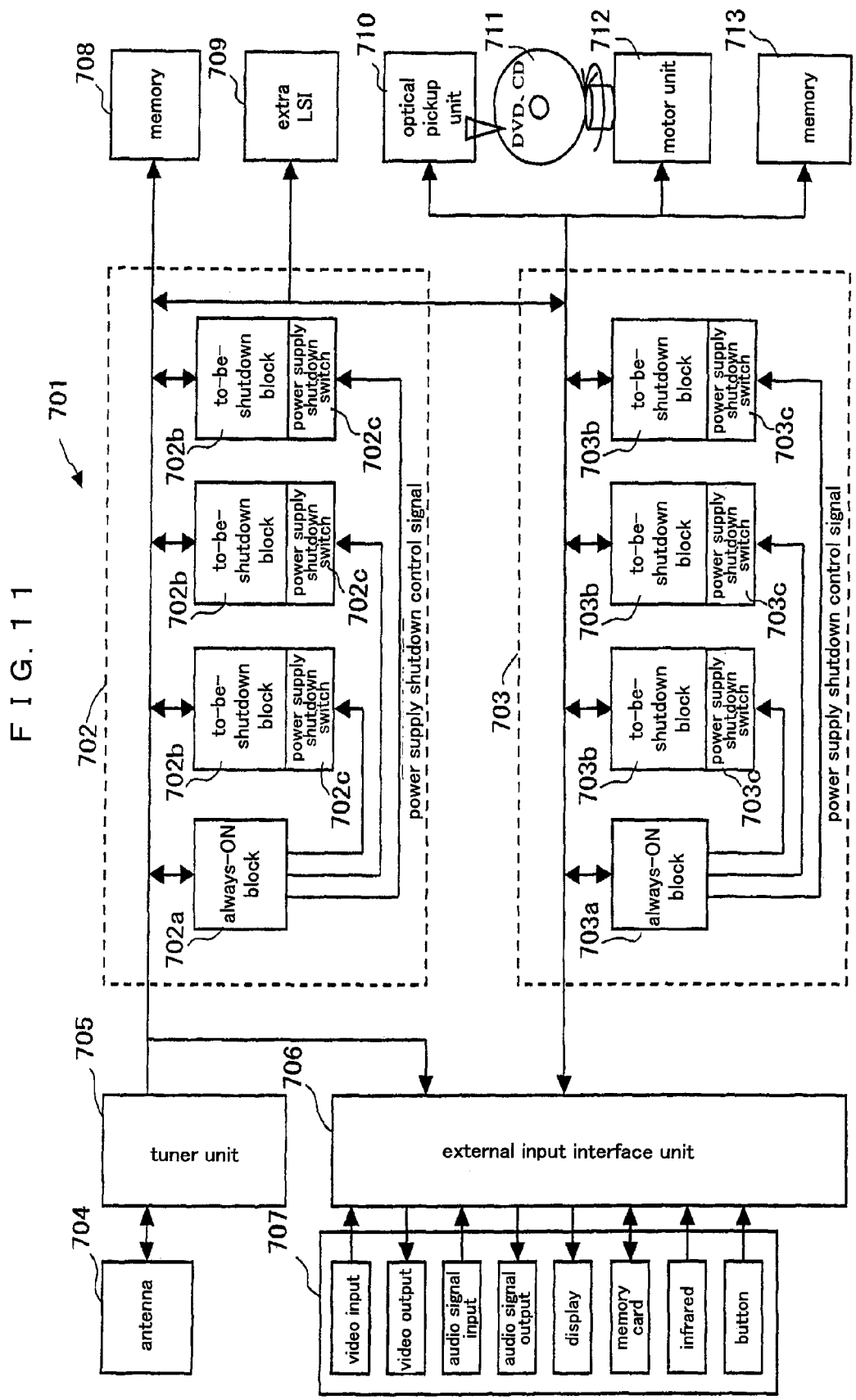
FIG. 11 a block diagram illustrating a constitution of the optical disc in which the semiconductor integrated circuit according to the present invention is incorporated.

FIG. 11 is a block diagram illustrating a constitution of the optical disc device wherein the semiconductor integrated circuit according to the present invention is incorporated. In FIG. 11, structural components are simply shown with their component names, and will not be described in detail.

The media signal processing LSI 702 comprises a circuit block which is a basic component for processing a media signal in the device, and the error correction/servo processing LSI 703 comprises a circuit block for executing the error correction and the servo processing in the device. The media signal processing LSI 702 comprises an always-ON block 702a, a to-be-shutdown block 702b and a power supply shutdown switch block 702c. The error correction/servo processing LSI 703 comprises an always-ON block 703a, a to-be-shutdown block 703b and a power supply shutdown switch block 703c. In the error correction/servo processing LSI 703 and the media signal processing LSI 702 the error correction/servo processing LSI 703, the always-ON blocks 702a and 703a, the to-be-shutdown blocks 702b and 703b, and the power supply shutdown switches 702c and 703c are constituted in the same manner as the semiconductor integrated circuits according to the respective preferred embodiments described so far.

Referring to reference numerals shown in FIG. 11, 704 denotes an antenna, 705 denotes a tuner unit, 706 denotes an external input interface unit, 707 denotes a function unit for executing various functions (video input function, video output function, audio signal input function, audio signal output function, display function, memory card input/output function, infrared signal receiving function, operation button input recognizing function, and the like), 708 denotes a memory, 709 denotes an extra LSI, and 710 denotes an optical pickup, 711 denotes an external recording medium such as DVD or CD, 712 denote a motor unit, and 713 denotes a memory.

The operation of the semiconductor integrated circuit according to the present invention incorporated in the media signal processing LSI 702 is carried out based on the various types of processing in the function unit 707 (infrared signal reception, recognition of inputs via operation buttons, DVD signal output, and the like), and electric wave inputted to the antenna 704. Further, the operation according to the present invention in the error correction/servo processing LSI 703 is carried out based on the various types of processing in the function unit 707 (infrared signal reception, recognition of inputs via operation buttons, DVD signal output, and the like). FIG. 11 is an illustration of an example of the constitution wherein the semiconductor integrated circuit according to the present invention is incorporated in the optical disc device, and the functions of the optical disc device 701 are not necessarily limited to those described above. Other functions can be added or the constitution may be altered unless any system failure thereby occurs. Further, the functions included in the respective LSIs may be variously altered as far as they can be integrated.

The information reproducing device provided with the semiconductor integrated circuit according to the present invention is not necessarily limited to an optical disc device, and may include an image recording/reproducing device in which a magnetic disc is incorporated, an information recording/reproducing device in which a semiconductor memory is used as a medium, and the like, other than an optical disc device. By implementing the present invention, all kinds of information reproducing devices (which may include an information recording function), regardless of types of media in which information is recorded, can effectively reduce the power consumption.

Figure 12:
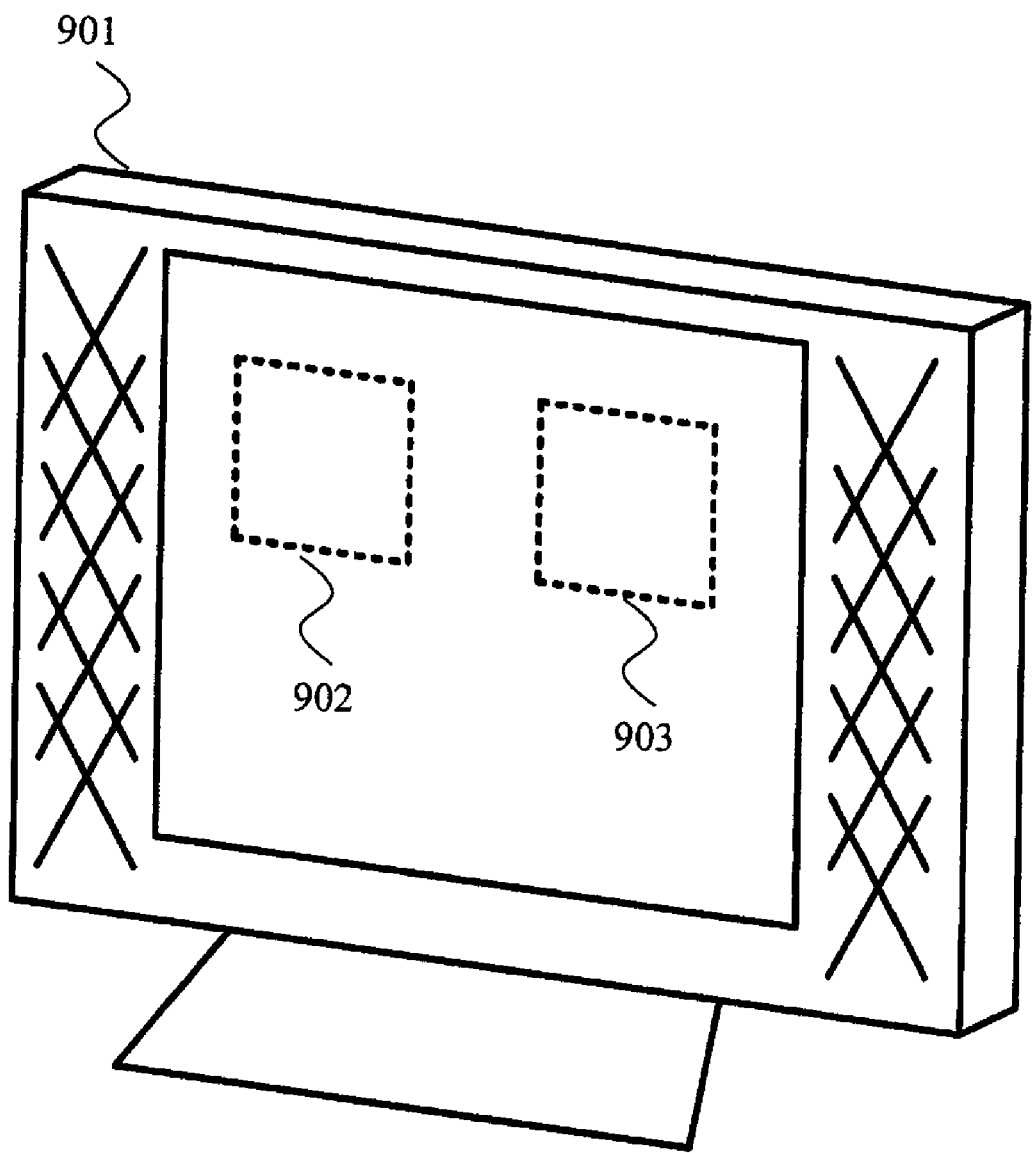
FIG. 12 is a schematic perspective view of a television receiver which is an example of an image display device in which the semiconductor integrated circuit according to the present invention is incorporated.

FIG. 12 is a schematic illustration of a television receiver which is an example of an image display device provided with the semiconductor integrated circuit according to the present invention. A television receiver 901 comprises an image/audio processing LSI 902 for processing an image signal and an audio signal, and a display/sound source control LSI 903 for controlling devices such as a display screen and a speaker. In the image/audio processing LSI 902 and the display/sound source control LSI 903, the semiconductor integrated circuit according to the present invention is incorporated.

The semiconductor integrated circuit according to the present invention can be operated with less power consumption in comparison to the conventional semiconductor integrated circuits. Therefore, the image/audio processing LSI 902, the display/sound source control LSI 903 and the television receiver 901 comprising these LSIs can be operated with less electric power. Further, a similar effect (operation with less electric power) can be achieved when the semiconductor integrated circuit according to the present invention is used as any semiconductor integrated circuit provided in the television receiver 901 other than the image/audio processing LSI 902 and the display/sound source control LSI 903.

Figure 13:
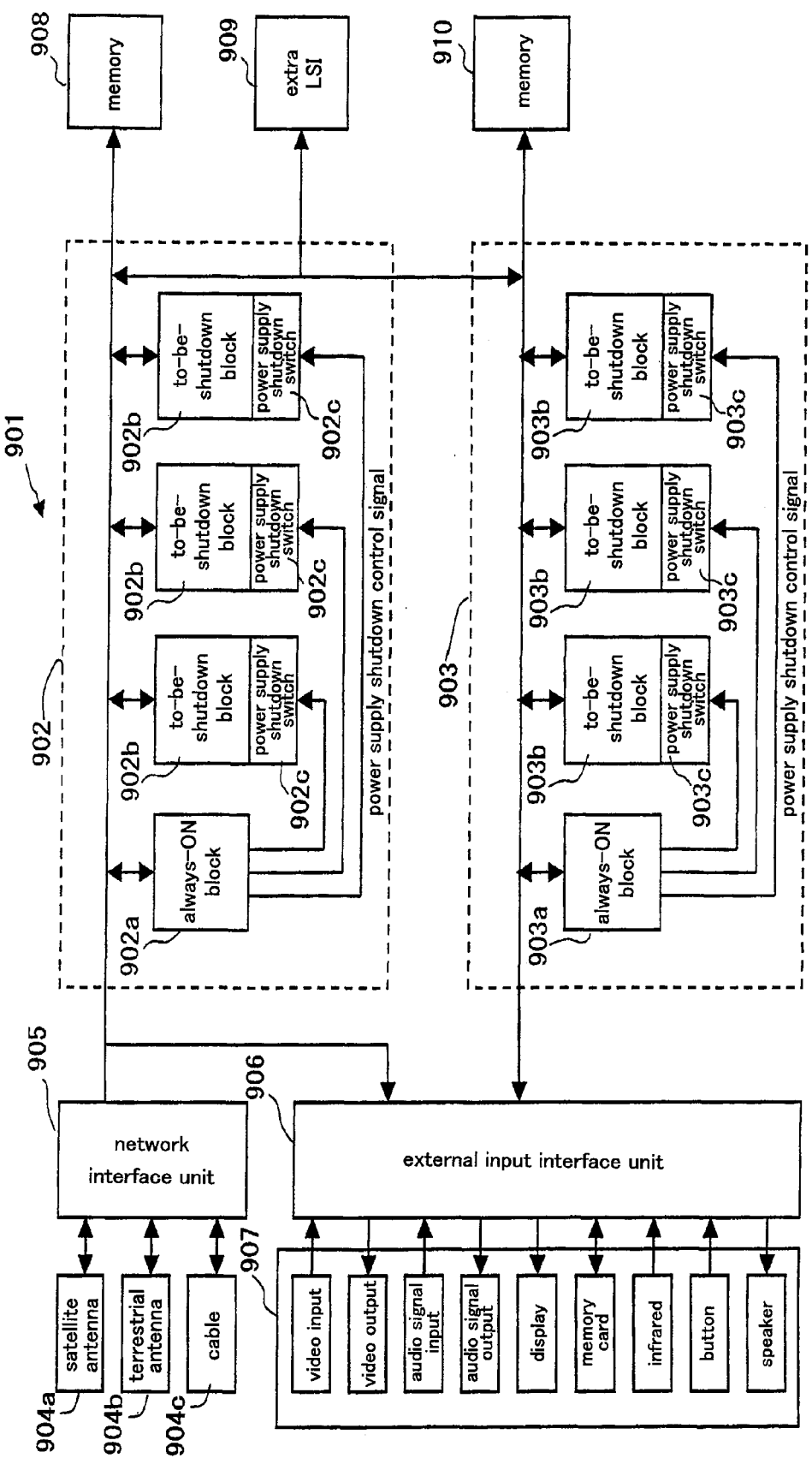
FIG. 13 is a block diagram illustrating a constitution of the television receiver in which the semiconductor integrated circuit according to the present invention is incorporated.

FIG. 13 is a block diagram illustrating a constitution of the television receiver in which the semiconductor integrated circuit according to the present invention is incorporated. In the illustration of FIG. 13, structural components are simply shown with their component names, and will not be described in detail. The image/audio processing LSI 902 includes a circuit block which is a structural component for processing the image and audio in this device, and the display/sound source control LSI 903 includes a circuit block which is a structural component for controlling the display and sound source in this device. The image/audio processing LSI 902 comprises an always-ON block 902a, a to-be-shutdown block 902b and a power supply shutdown switch block 902c. The display/sound source control LSI 903 comprises an always-ON block 903a, a to-be-shutdown block 903b and a power supply shutdown switch block 903c. In the image/audio processing LSI 902 and the display/sound source control LSI 903, the always-ON blocks 902a and 903a, the to-be-shutdown blocks 902b and 903b, and the power supply shutdown switches 902c and 903c are constituted in the same manner as the semiconductor integrated circuits according to the respective preferred embodiments described so far.

In FIG. 13, 904a denotes a satellite antenna, 904b denotes a terrestrial antenna, 904 denotes a cable, 905 denotes a network interface unit, 906 denotes an external input interface unit, 907 denotes a function unit for executing various functions (video input function, video output function, audio signal input function, audio signal output function, display function, memory card input/output function, infrared signal receiving function, operation button input recognizing function, speaker function, and the like), 908 denotes a memory, 909 denotes an extra LSI, 910 denotes a memory.

The operation of the semiconductor integrated circuit according to the present invention incorporated in the image/audio processing LSI 902 is carried out based on the various types of processing in the function unit 907 (infrared signal reception, recognition of inputted operation buttons, video input, and the like), and electric wave inputted to the antennas 904a and 904b. The operation of the semiconductor integrated circuit according to the present invention incorporated in the display/sound source control LSI 903 is carried out based on the various types of processing in the function unit 907 (infrared signal reception, recognition of inputted operation buttons, video input, and the like), and electric wave inputted to the antennas 904a and 904b. FIG. 13 is an illustration of an example of an information reproducing device in which the semiconductor integrated circuit according to the present invention is incorporated, and the functions of the television receiver 901 are not necessarily limited to those described above. Other functions can be added or the constitution may be altered unless any system failure thereby occurs. Further, the functions included in the respective LSIs may be variously altered as far as they can be integrated.

The image display device provided with the semiconductor integrated circuit according to the present invention is not necessarily limited to the television receiver, and includes, for example, a device for displaying streaming data distributed over an electric communication wire other than the television receiver. Because of the present invention, the power consumption can be effectively reduced in all kinds of image display devices irrespective of an information transmitting method adopted therein.

Figure 14:
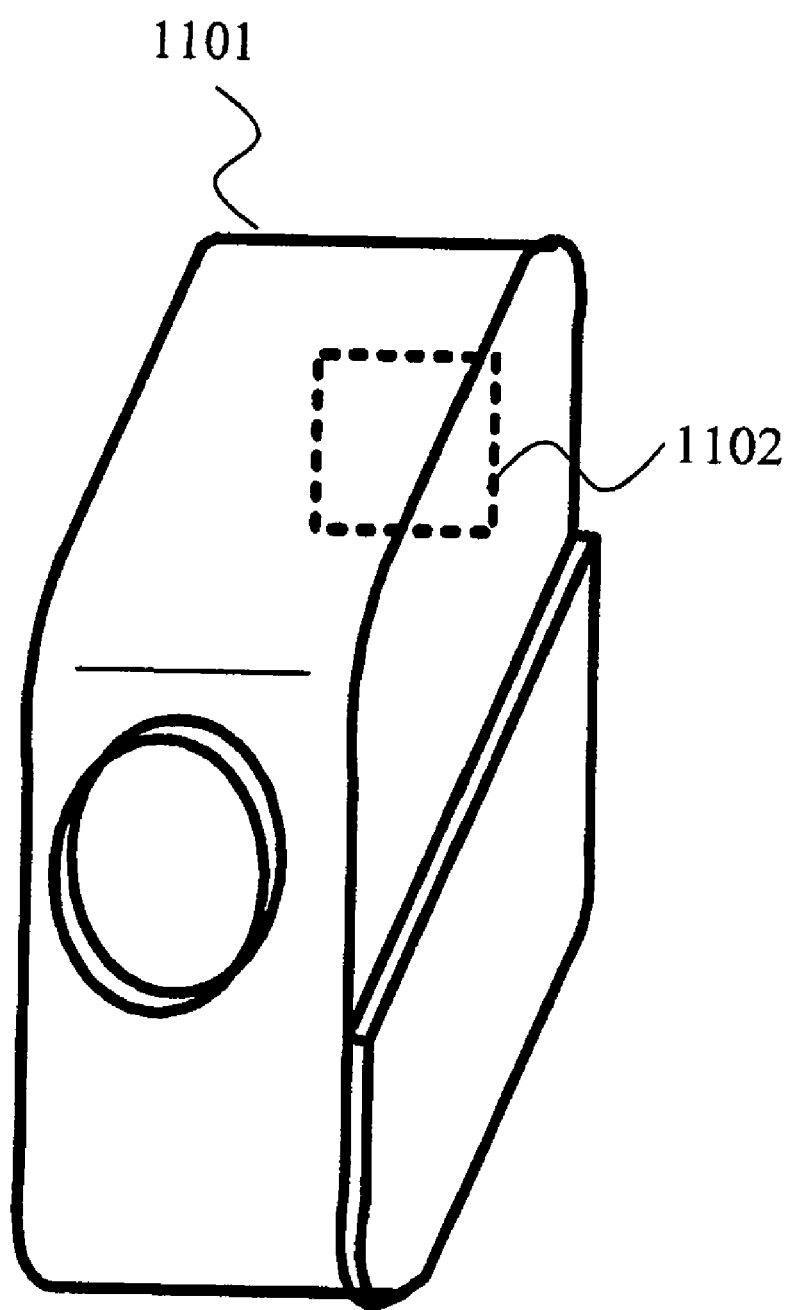
FIG. 14 is a schematic perspective view of a digital camera which is an example of an electronic device in which the semiconductor integrated circuit according to the present invention is incorporated.

FIG. 14 is a schematic illustration of a digital camera which is an example of an electronic device provided with the semiconductor integrated circuit according to the present invention. A digital camera 1101 comprises a signal processing LSI 1102 which is a semiconductor integrated circuit in which the semiconductor integrated circuit according to the present invention is used. Since the semiconductor integrated circuit according to the present invention can be operated with less power consumption in comparison to the conventional semiconductor integrated circuits, the signal processing LSI 1102 and digital camera 1101 can be operated with less electric power. Further, when any semiconductor integrated circuit other than the signal processing LSI 1102 provided in the digital camera 1101 is also constituted in the same manner as the semiconductor integrated circuit according to the present invention, a similar effect (operation with less electric power) can be achieved.

Figure 15:
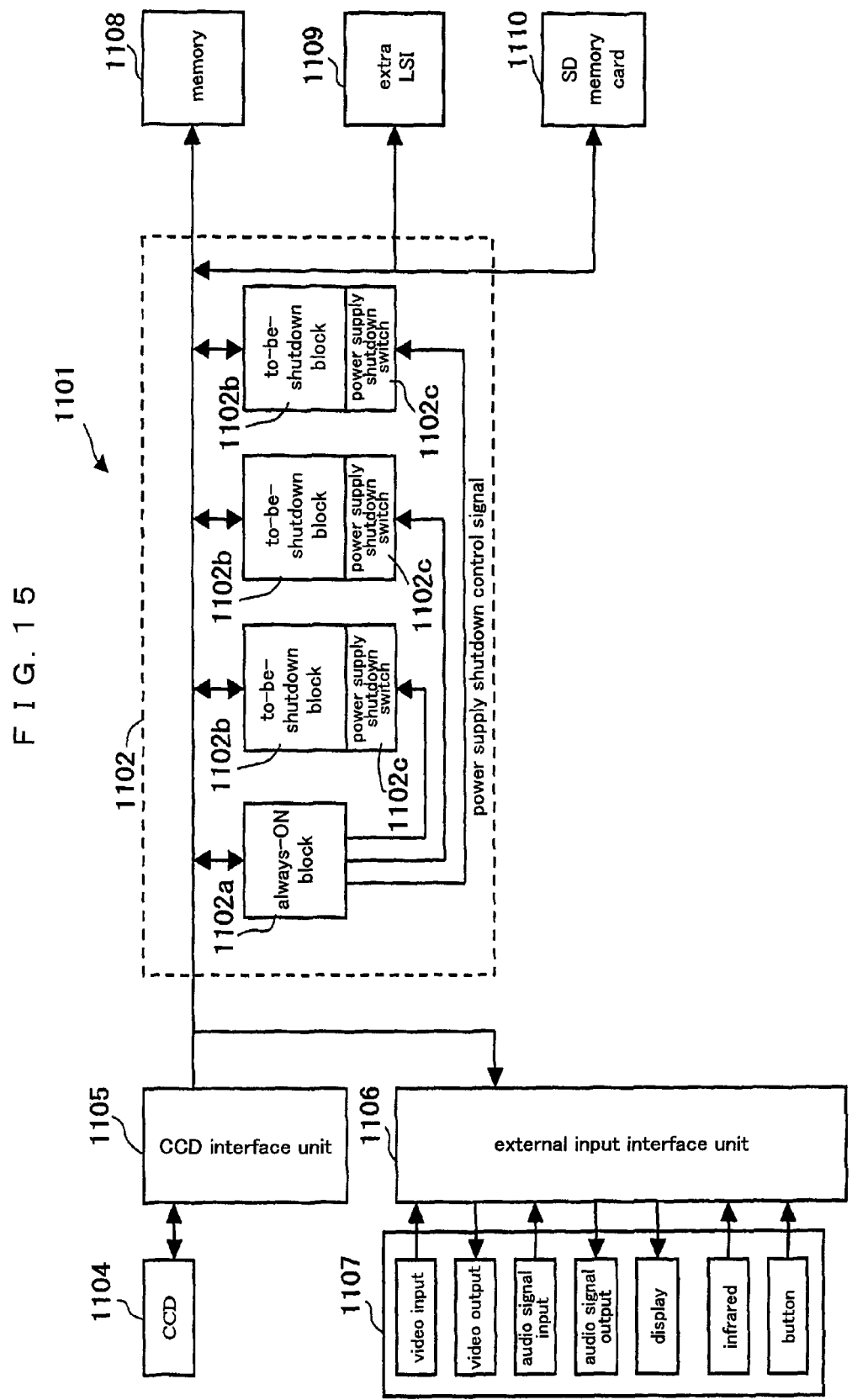
FIG. 15 is a block diagram illustrating a constitution of the digital camera in which the semiconductor integrated circuit according to the present invention is incorporated.

FIG. 15 is a block diagram illustrating a constitution of the electronic device in which the semiconductor integrated circuit according to the present invention is incorporated. In the illustration of FIG. 15, structural components are simply shown with their component names, and will not be described in detail.

The signal processing LSI 1102 is a circuit block which is a structural component for processing a signal in the device, and comprises an always-ON block 1102a, a to-be-shutdown block 1102b and a power supply shutdown switch block 1102c. The always-ON block 1102a, to-be-shutdown block 1102b and power supply shutdown switch block 1102c are constituted in the same manner as the semiconductor integrated circuits according to the preferred embodiments described so far.

Referring to reference numerals shown in FIG. 15, 1104 denotes a CCD, 1105 denotes a CCD interface unit, 1106 denotes an external interface unit, 1107 denotes a function unit for executing various functions (video input function, video output function, audio signal input function, audio signal output function, display function, infrared signal receiving function, operation button input recognizing function, and the like), 1108 denotes a memory, 1109 denotes an extra LSI, 1110 denotes a memory.

The operation of the semiconductor integrated circuit according to the present invention incorporated in the signal processing LSI 1102 is carried out based on the various types of processing in the function unit 1107 (infrared signal reception, recognition of inputted operation buttons, and the like), and video signals outputted from the CCD 1104. FIG. 15 is an illustration of an example of the constitution wherein the semiconductor integrated circuit according to the present invention is incorporated in the electronic device, and the functions of the digital camera 1101 are not necessarily limited to those described above. Other functions can be added or the constitution may be altered unless any system failure thereby occurs. Further, the functions included in the respective LSIs may be variously altered as far as they can be integrated.

The electronic device provided with the semiconductor integrated circuit according to the present invention is not necessarily limited to the digital camera, and includes all kinds of devices comprising a semiconductor integrated circuit such as various sensor devices and electronic calculators other than the digital camera. Because of the present invention, these electronic devices can obtain the same effect as described earlier (reduction of power consumption).

FIG. 16 is a schematic illustration of an automobile 1301 in which an electronic control device 1302 and a navigation device 1304 are incorporated. The automobile 1301 is an example of a mobile object in which the semiconductor integrated circuit according to the present invention is incorporated. The electronic control device 1302 comprises an engine/transmission control LSI 1303 for controlling the engine and the transmission of the automobile 1301. The navigation device 1304 comprises a navigation LSI 1305. In the engine/transmission control LSI 1303 and the navigation LSI 1305, the semiconductor integrated circuit according to the present invention is provided.

Since the semiconductor integrated circuit according to the present invention can be operated with less power consumption in comparison to the conventional semiconductor integrated circuits, the engine/transmission control LSI 1303 and the electronic control device 1302 provided therewith can be operated with less electric power. In a similar manner, the navigation LSI 1305 and the navigation device 1304 provided therewith can also be operated with less electric power. When the semiconductor integrated circuit according to the present invention is used as any semiconductor integrated circuit provided in the electronic control device 1302 other than the engine/transmission control LSI 1303, a similar effect (operation with less electric power) can be obtained, and the same applies to the navigation device 1304. Since power consumption in the electronic control device 1302 and the navigation device 1304 is reduced, the power consumption in the automobile 1301 is also reduced.

FIG. 17 is a block diagram illustrating a constitution of the automobile comprising the electronic control device and the navigation device each provided with the semiconductor integrated circuit according to the present invention. In the illustration of FIG. 17, structural components are simply shown with their component names, and will not be described in detail.

The engine/transmission control LSI 1303 is a circuit block which is a structural component for controlling the engine and transmission in the device. The navigation LSI 1305 is a circuit block in charge of the navigation in the device. The engine/transmission control LSI 1303 comprises an always-ON block 1303*a*, a to-be-shutdown block 1303*b* and a power supply shutdown switch block 1303*c*. The navigation LSI 1305 comprises an always-ON block 1305*a*, a to-be-shutdown block 1305*b* and a power supply shutdown switch block 1305*c*. In the transmission control LSI 1303 and the navigation LSI 1305, the always-ON blocks 1303*a* and 1305*a*, to-be-shutdown blocks 1303*b* and 1305*b* and power supply shutdown switch blocks 1303*c* and 1305*c* are constituted in the same manner as the semiconductor integrated circuits according to the preferred embodiments described so far.

In FIG. 17, 1306*a* denotes an accelerator, 1306*b* denotes a brake, 1036*c* denotes a gear, 1307 and 1308 denote an interface unit, 1309 denotes a function unit for executing various functions (TV icon processing function, radio antenna receiving function, GPS antenna receiving function, display function, memory card input/output function, infrared signal receiving function, operation button input recognizing function, audio signal output function, side-braking function, and the like), 1310 denotes a memory, 1311 denotes an extra LSI, 1312 denotes an engine, 1313 denotes a transmission, 1314 denotes a memory, 1315 denotes another extra LSI.

The operation of the semiconductor integrated circuit according to the present invention provided in the engine/transmission control LSI 1303 is carried out based on the operations of the accelerator 1306*a*, brake 1306*b*, gear 1306*c*, and the like, detected by the electronic control device 1302. The operation according to the present invention in the navigation LSI 1305 is carried out when the various functions in the function unit 1309 (radio wave inputted to the TV antennas, infrared signal reception, recognition of inputted operation buttons, and the like) are detected by the navigation device 1304. The automobile 1301 illustrated in FIG. 17 represents an example of a mobile object in which the semiconductor integrated circuit according to the present invention is provided (the semiconductor integrated circuit according to the present invention is provided in the electronic control device 1302 and the navigation device 1304). The functions of the automobile 1301, including the electronic control device 1302 and the navigation device 1304, are not necessarily limited to those described above, and other functions can be added or the constitution may be altered unless any system failure thereby occurs. Further, the functions included in the respective LSIs may be variously altered as far as they can be integrated.

The electronic control device provided with the semiconductor integrated circuit according to the present invention is not necessarily limited to such a device for controlling the engine and transmission as described earlier, and includes all kinds of devices for controlling a power source provided with a semiconductor integrated circuit such as a motor control device other than the before-mentioned one. Because of the present invention, these electronic devices can also effectively reduce their power consumption.

The mobile object provided with the semiconductor integrated circuit according to the present invention is not necessarily limited to the automobile, and includes all kinds of mobile objects comprising an electronic control device for controlling a power source such as an engine or a motor other than the automobile, examples of which are a train and an airplane. Because of the present invention, these mobile objects can achieve the same effect as described earlier (reduction of power consumption).

Industrial Applicability

According to the present invention, a circuit malfunction, which has been a problem in achieving a faster shutdown/recovery in the conventional power supply shutdown technology, can be prevented from happening. Further, since the method adopted by the present invention can be easily carried out in such a simplified manner, the present invention can be developed into different applications. As described so far, the major bottleneck in using the technology for reducing the power consumption of LSI can be eliminated, and the effect of lowering power consumption in LSI can be consequently maximized.

What is claimed is:

1. A semiconductor integrated circuit comprising:
   a first circuit block connected to a power supply wire or a ground wire;
   a second circuit block connected to the power supply wire or the ground wire to which the first circuit block is connected;
   a power supply potential detecting circuit for detecting a power supply potential of the second circuit block when the first circuit block shifts from a power supply shutdown state to a power supply feeding state or shifts from the power supply feeding state to the power supply shutdown state; and
   an operation control circuit for temporarily stopping a function of the second circuit block when the first circuit block shifts from the power supply shutdown state to the power supply feeding state or shifts from the power supply feeding state to the power supply shutdown state and then recovering the function of the second circuit block based on a detection result outputted from the power supply potential detecting circuit.

2. The semiconductor integrated circuit as claimed in claim 1, wherein the operation control circuit recovers the function of the second circuit block when it is judged based on the outputted detection result that the power supply potential of the second circuit block is stabilized.

3. The semiconductor integrated circuit as claimed in claim 1, further comprising a storage circuit for storing input data to be inputted to the second circuit block, wherein
   the operation control circuit temporarily stops the function of the second circuit block after the input data of the second circuit block is stored in the storage circuit, and
   the second circuit block reads the input data from the storage circuit when the function is recovered.

4. The semiconductor integrated circuit as claimed in claim 3, further comprising:
   a first power supply for feeding power to the first circuit block;
   a second power supply for feeding power to the second circuit block; and
   a third power supply for feeding power to the storage circuit, wherein the first, second and third power supplies independently feed different power supply potentials to power supply destinations thereof.

5. The semiconductor integrated circuit as claimed in claim 1, further comprising a timer circuit for counting a stoppage period of the second circuit block.

6. The semiconductor integrated circuit as claimed in claim 1, further comprising:
   a first power supply for feeding power to the first circuit block; and
   a second power supply for feeding power to the second circuit block, wherein
   the first and second power supplies independently feed different power supply potentials to power supply destinations thereof.

7. The semiconductor integrated circuit as claimed in claim 6, wherein a power supply voltage to be fed to the second circuit block by the second power supply is increased to a level higher than a power supply voltage to be fed to the first circuit block by the first power supply.

8. A semiconductor integrated circuit comprising:
   a first circuit block connected to a power supply wire or a ground wire;
   a second circuit block connected to the power supply wire or the ground wire to which the first circuit block is connected;
   an operation control circuit for temporarily stopping a function of the second circuit block when the first circuit block shifts from a power supply shutdown state to a power supply feeding state or shifts from the power supply feeding state to the power supply shutdown state and then recovering the function of the second circuit block;
   a first power supply shutdown switch for disconnecting the first circuit block from the power supply wire or the ground wire when the first circuit block is in a non-operating state; and
   a delay adjusting circuit for adjusting a length of time when the first circuit block is connected to or disconnected from the power supply wire or the ground wire using the first power supply shutdown switch.

9. The semiconductor integrated circuit as claimed in claim 8, wherein the delay adjusting circuit adjusts a length of time when the first circuit block is connected to or disconnected from the power supply wire or the ground wire so that the shift of the connection state between the first circuit block and the power supply wire or the ground wire is completed before the shift of the power supply state of the second circuit block is completed by the operation control circuit.

10. The semiconductor integrated circuit as claimed in claim 8, further comprising a second power supply shutdown switch for disconnecting the second circuit block from the power supply wire or the ground wire when the second circuit block is in a non-operation state.

11. The semiconductor integrated circuit as claimed in claim 8, further comprising a storage circuit for storing input data to be inputted to the second circuit block, wherein
   the operation control circuit temporarily stops the function of the second circuit block after the input data of the second circuit block is stored in the storage circuit, and
   the second circuit block reads the input data from the storage circuit when the function is recovered.

12. The semiconductor integrated circuit as claimed in claim 11, further comprising:
   a first power supply for feeding power to the first circuit block;
   a second power supply for feeding power to the second circuit block; and
   a third power supply for feeding power to the storage circuit, wherein
   the first, second and third power supplies independently feed different power supply potentials to power supply destinations thereof.

13. The semiconductor integrated circuit as claimed in claim 8, further comprising a timer circuit for counting a stoppage period of the second circuit block.

14. The semiconductor integrated circuit as claimed in claim 8, further comprising:
   a first power supply for feeding power to the first circuit block; and
   a second power supply for feeding power to the second circuit block, wherein
   the first and second power supplies independently feed different power supply potentials to power supply destinations thereof.

15. The semiconductor integrated circuit as claimed in claim 14, wherein a power supply voltage to be fed to the second circuit block by the second power supply is increased to a level higher than a power supply voltage to be fed to the first circuit block by the first power supply.

16. A semiconductor integrated circuit comprising:
   a first circuit block connected to a ground wire;
   a second circuit block connected to the ground wire to which the first circuit block is connected;
   a first power supply for feeding power to the first circuit block;
   a second power supply for feeding power to the second circuit block; and
   an operation control circuit for temporarily stopping a function of the second circuit block when the first circuit block shifts from a power supply shutdown state to a power supply feeding state or shifts from the power supply feeding state to the power supply shutdown state and then recovering the function of the second circuit block, wherein
   the first and second power supplies independently feed different power supply potentials to power supply destinations thereof.

17. The semiconductor integrated circuit as claimed in claim 16, further comprising a storage circuit for storing input data to be inputted to the second circuit block, wherein
   the operation control circuit temporarily stops the function of the second circuit block after the input data of the second circuit block is stored in the storage circuit, and
   the second circuit block reads the input data from the storage circuit when the function is recovered.

18. The semiconductor integrated circuit as claimed in claim 17, further comprising a third power supply for feeding power to the storage circuit, wherein
   the first, second and third power supplies independently feed different power supply potentials to power supply destinations thereof.

19. The semiconductor integrated circuit as claimed in claim 16, further comprising a timer circuit for counting a stoppage period of the second circuit block.

20. The semiconductor integrated circuit as claimed in claim 16, wherein a power supply voltage to be fed to the second circuit block by the second power supply is increased to a level higher than a power supply voltage to be fed to the first circuit block by the first power supply.

21. A communication device comprising:
the semiconductor integrated circuit claimed in claim 1; and
a high-frequency transmission/reception interface unit and an external input interface unit each connected to the semiconductor integrated circuit, wherein
whether the first circuit block or the second circuit block is operated or not operated is determined based on a wireless signal or a wired signal received by way of the high-frequency transmission/reception interface unit or the external input interface unit.

22. A communication device comprising:
the semiconductor integrated circuit claimed in claim 8; and
a high-frequency transmission/reception interface unit and an external input interface unit each connected to the semiconductor integrated circuit, wherein
whether the first circuit block or the second circuit block is operated or not operated is determined based on a wireless signal or a wired signal received by way of the high-frequency transmission/reception interface unit or the external input interface unit.

23. A communication device comprising:
the semiconductor integrated circuit claimed in claim 16; and
a high-frequency transmission/reception interface unit and an external input interface unit each connected to the semiconductor integrated circuit, wherein
whether the first circuit block or the second circuit block is operated or not operated is determined based on a wireless signal or a wired signal received by way of the high-frequency transmission/reception interface unit or the external input interface unit.

24. An information reproducing device comprising:
the semiconductor integrated circuit claimed in claim 1; and
a tuner unit and an interface unit each connected to the semiconductor integrated circuit, wherein
whether the first circuit block or the second circuit block is operated or not operated is determined based on a wireless signal or a wired signal received by way of the tuner unit or the interface unit.

25. An information reproducing device comprising:
the semiconductor integrated circuit claimed in claim 8; and
a tuner unit and an interface unit each connected to the semiconductor integrated circuit, wherein
whether the first circuit block or the second circuit block is operated or not operated is determined based on a wireless signal or a wired signal received by way of the tuner unit or the interface unit.

26. An information reproducing device comprising:
the semiconductor integrated circuit claimed in claim 16; and
a tuner unit and an interface unit each connected to the semiconductor integrated circuit, wherein
whether the first circuit block or the second circuit block is operated or not operated is determined based on a wireless signal or a wired signal received by way of the tuner unit or the interface unit.

27. An image display device comprising:
the semiconductor integrated circuit claimed in claim 1; and
a network interface unit and an external input interface unit each connected to the semiconductor integrated circuit, wherein
whether the first circuit block or the second circuit block is operated or not operated is determined based on a wireless signal or a wired signal received by way of the network interface unit or the external input interface unit.

28. An image display device comprising:
the semiconductor integrated circuit claimed in claim 8; and
a network interface unit and an external input interface unit each connected to the semiconductor integrated circuit, wherein
whether the first circuit block or the second circuit block is operated or not operated is determined based on a wireless signal or a wired signal received by way of the network interface unit or the external input interface unit.

29. An image display device comprising:
the semiconductor integrated circuit claimed in claim 16; and
a network interface unit and an external input interface unit each connected to the semiconductor integrated circuit, wherein
whether the first circuit block or the second circuit block is operated or not operated is determined based on a wireless signal or a wired signal received by way of the network interface unit or the external input interface unit.

30. An electronic device comprising:
the semiconductor integrated circuit claimed in claim 1; and
a CCD interface unit and an external input interface unit each connected to the semiconductor integrated circuit, wherein
whether the first circuit block or the second circuit block is operated or not operated is determined based on a wireless signal or a wired signal received by way of the CCD interface unit or the external input interface unit.

31. An electronic device comprising:
the semiconductor integrated circuit claimed in claim 8; and
a CCD interface unit and an external input interface unit each connected to the semiconductor integrated circuit, wherein
whether the first circuit block or the second circuit block is operated or not operated is determined based on a wireless signal or a wired signal received by way of the CCD interface unit or the external input interface unit.

32. An electronic device comprising:
the semiconductor integrated circuit claimed in claim 16; and
a CCD interface unit and an external input interface unit each connected to the semiconductor integrated circuit, wherein
whether the first circuit block or the second circuit block is operated or not operated is determined based on a wireless signal or a wired signal received by way of the CCD interface unit or the external input interface unit.

33. An electronic control device comprising:
the semiconductor integrated circuit claimed in claim 1; and
a navigation interface unit connected to the semiconductor integrated circuit, wherein
whether the first circuit block or the second circuit block is operated or not operated is determined based on a wireless signal or a wired signal received by way of the navigation interface unit.

34. An electronic control device comprising:
the semiconductor integrated circuit claimed in claim 8; and
a navigation interface unit connected to the semiconductor integrated circuit, wherein
whether the first circuit block or the second circuit block is operated or not operated is determined based on a wireless signal or a wired signal received by way of the navigation interface unit.

35. An electronic control device comprising:
the semiconductor integrated circuit claimed in claim 16; and
a navigation interface unit connected to the semiconductor integrated circuit, wherein
whether the first circuit block or the second circuit block is operated or not operated is determined based on a wireless signal or a wired signal received by way of the navigation interface unit.

* * * * *